US010896908B2

(12) United States Patent
Costa et al.

(10) Patent No.: US 10,896,908 B2
(45) Date of Patent: Jan. 19, 2021

(54) BULK CMOS DEVICES WITH ENHANCED PERFORMANCE AND METHODS OF FORMING THE SAME UTILIZING BULK CMOS PROCESS

(71) Applicant: Qorvo US, Inc., Greensboro, NC (US)

(72) Inventors: Julio C. Costa, Oak Ridge, NC (US); Michael Carroll, Jamestown, NC (US); Dirk Robert Walter Leipold, San Jose, CA (US); George Maxim, Saratoga, CA (US); Baker Scott, San Jose, CA (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 16/368,210

(22) Filed: Mar. 28, 2019

(65) Prior Publication Data
US 2019/0304977 A1 Oct. 3, 2019

Related U.S. Application Data

(60) Provisional application No. 62/649,351, filed on Mar. 28, 2018.

(51) Int. Cl.
*H01L 23/00* (2006.01)
*H01L 27/092* (2006.01)
(Continued)

(52) U.S. Cl.
CPC .... *H01L 27/0928* (2013.01); *H01L 21/02381* (2013.01); *H01L 21/30604* (2013.01);
(Continued)

(58) Field of Classification Search
CPC ....... H01L 23/00; H01L 23/31; H01L 23/522; H01L 23/5226; H01L 23/3121;
(Continued)

(56) References Cited

U.S. PATENT DOCUMENTS 4,093,562 A 6/1978 Kishimoto
4,366,202 A 12/1982 Borovsky
(Continued)

FOREIGN PATENT DOCUMENTS

CN 103811474 A 5/2014
CN 103872012 A 6/2014
(Continued)

OTHER PUBLICATIONS

Office Action for Japanese Patent Application No. 2018-526613, dated Nov. 5, 2019, 8 pages.
(Continued)

*Primary Examiner* — Chuong A Luu
(74) *Attorney, Agent, or Firm* — Withrow & Terranova, P.L.L.C.

(57) ABSTRACT

The present disclosure relates to a bulk complementary-metal-oxide-semiconductor (CMOS) device including a device substrate, a thinned device die with a device region over the device substrate, a first mold compound, and a second mold compound. The device region includes a back-end-of-line (BEOL) portion and a front-end-of-line (FEOL) portion over the BEOL portion. The first mold compound resides over the device substrate, surrounds the thinned device die, and extends vertically beyond the thinned device die to define an opening over the thinned device die and within the first mold compound. The second mold compound fills the opening and directly connects the thinned device die. Herein, a silicon material with a resistivity between 5 Ohm-cm and 30000 Ohm-cm does not exist between the second mold compound and the thinned device die.

12 Claims, 12 Drawing Sheets

Figure 1:
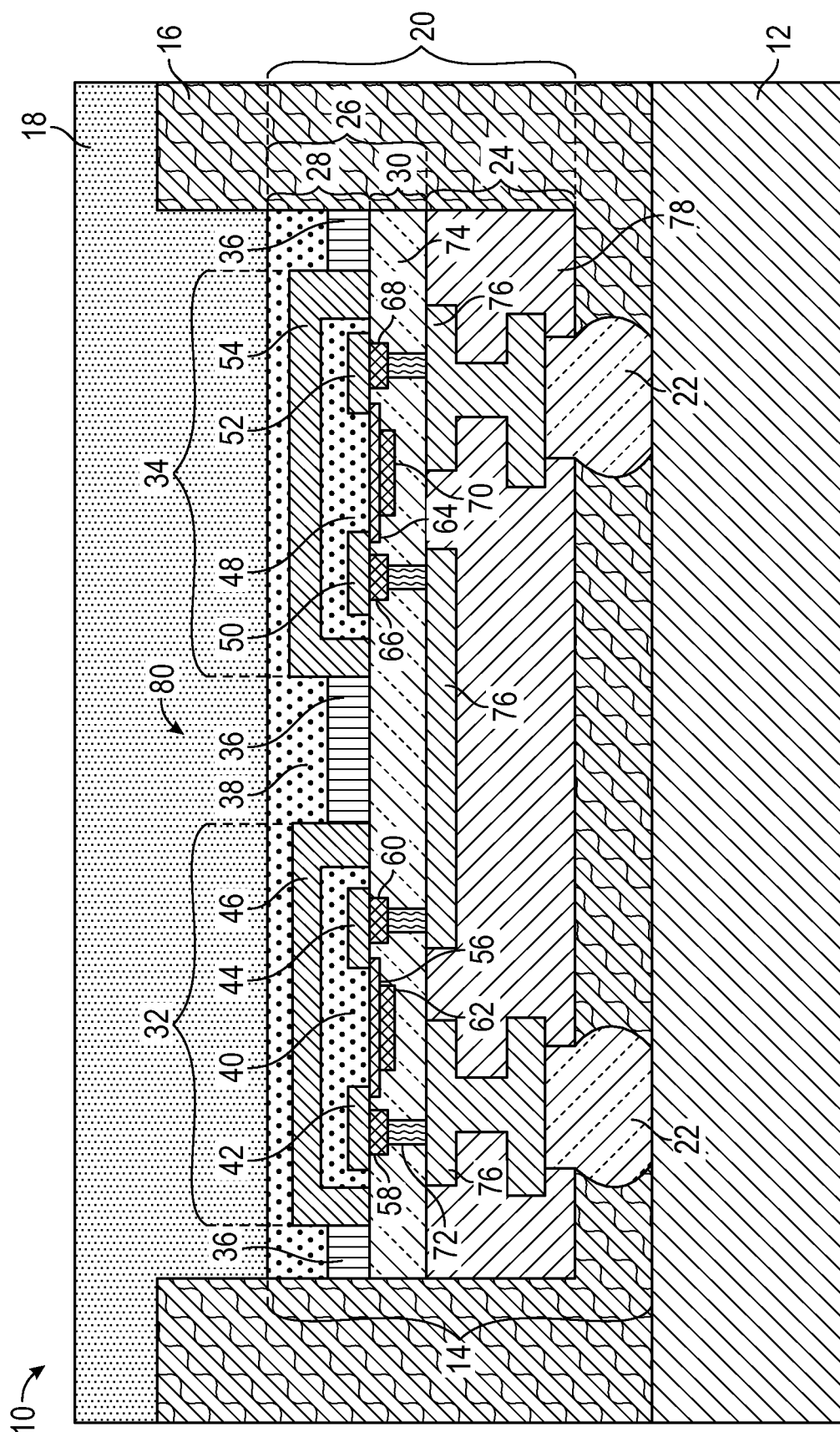

(51) Int. Cl.
    *H01L 23/522* (2006.01)
    *H01L 23/31* (2006.01)
    *H01L 21/56* (2006.01)
    *H01L 29/06* (2006.01)
    *H01L 21/02* (2006.01)
    *H01L 21/8238* (2006.01)
    *H01L 29/16* (2006.01)
    *H01L 21/306* (2006.01)

(52) U.S. Cl.
    CPC .... *H01L 21/565* (2013.01); *H01L 21/823871* (2013.01); *H01L 21/823892* (2013.01); *H01L 23/3121* (2013.01); *H01L 23/5226* (2013.01); *H01L 24/17* (2013.01); *H01L 29/0696* (2013.01); *H01L 29/16* (2013.01)

(58) Field of Classification Search
    CPC ... H01L 23/525; H01L 23/5258; H01L 23/36; H01L 23/64; H01L 23/373; H01L 23/498; H01L 23/645; H01L 23/49822; H01L 23/367; H01L 23/433; H01L 23/495; H01L 23/538; H01L 23/49575; H01L 23/3677; H01L 23/49579; H01L 23/49541; H01L 23/49503; H01L 23/49568; H01L 24/17; H01L 24/13; H01L 24/16; H01L 24/32; H01L 24/73; H01L 24/81; H01L 24/82; H01L 24/19; H01L 24/83; H01L 24/24; H01L 27/092; H01L 27/0928; H01L 27/24; H01L 29/06; H01L 29/16; H01L 29/0696; H01L 2224/131; H01L 2224/13147; H01L 2224/16227; H01L 2224/32225; H01L 2224/73204; H01L 2224/81815; H01L 2224/92125; H01L 2224/97; H01L 2224/04105; H01L 2224/12105; H01L 2224/24137; H01L 2224/32245; H01L 2224/73267; H01L 2224/9222; H01L 2224/83192; H01L 2924/00; H01L 2924/15313; H01L 2924/18161; H01L 2924/19042; H01L 2924/19105; H01L 2924/3511; H01L 2924/12042; H01L 2924/181; H01L 2924/15311; H01L 2924/15312; H01L 2924/15747; H01L 2924/15787
    USPC ........................................................ 257/368
    See application file for complete search history.

(56) References Cited

U.S. PATENT DOCUMENTS

| | | | |
|---|---|---|---|
| 5,013,681 A | 5/1991 | Godbey et al. |
| 5,061,663 A | 10/1991 | Bolt et al. |
| 5,069,626 A | 12/1991 | Patterson et al. |
| 5,362,972 A | 11/1994 | Yazawa et al. |
| 5,391,257 A | 2/1995 | Sullivan et al. |
| 5,459,368 A | 10/1995 | Onishi et al. |
| 5,646,432 A | 7/1997 | Iwaki et al. |
| 5,648,013 A | 7/1997 | Uchida et al. |
| 5,699,027 A | 12/1997 | Tsuji et al. |
| 5,709,960 A | 1/1998 | Mays et al. |
| 5,729,075 A | 3/1998 | Strain |
| 5,831,369 A | 11/1998 | Fürbacher et al. |
| 5,920,142 A | 7/1999 | Onishi et al. |
| 6,072,557 A | 6/2000 | Kishimoto |
| 6,084,284 A | 7/2000 | Adamic, Jr. |
| 6,154,366 A | 11/2000 | Ma et al. |
| 6,154,372 A | 11/2000 | Kalivas et al. |
| 6,235,554 B1 | 5/2001 | Akram et al. |
| 6,236,061 B1 | 5/2001 | Walpita |
| 6,268,654 B1 | 7/2001 | Glenn et al. |
| 6,271,469 B1 | 8/2001 | Ma et al. |
| 6,377,112 B1 | 4/2002 | Rozsypal |
| 6,423,570 B1 | 7/2002 | Ma et al. |
| 6,426,559 B1 | 7/2002 | Bryan et al. |
| 6,441,498 B1 | 8/2002 | Song |
| 6,446,316 B1 | 9/2002 | Fürbacher et al. |
| 6,578,458 B1 | 6/2003 | Akram et al. |
| 6,649,012 B2 | 11/2003 | Masayuki et al. |
| 6,703,688 B1 | 3/2004 | Fitzgerald |
| 6,713,859 B1 | 3/2004 | Ma |
| 6,841,413 B2 | 1/2005 | Liu et al. |
| 6,864,156 B1 | 3/2005 | Conn |
| 6,902,950 B2 | 6/2005 | Ma et al. |
| 6,943,429 B1 | 9/2005 | Glenn et al. |
| 6,964,889 B2 | 11/2005 | Ma et al. |
| 6,992,400 B2 | 1/2006 | Tikka et al. |
| 7,042,072 B1 | 5/2006 | Kim et al. |
| 7,049,692 B2 | 5/2006 | Nishimura et al. |
| 7,109,635 B2 | 9/2006 | McClure et al. |
| 7,183,172 B2 | 2/2007 | Lee et al. |
| 7,238,560 B2 | 7/2007 | Sheppard et al. |
| 7,279,750 B2 | 10/2007 | Jobetto |
| 7,288,435 B2 | 10/2007 | Aigner et al. |
| 7,307,003 B2 | 12/2007 | Reif et al. |
| 7,393,770 B2 | 7/2008 | Wood et al. |
| 7,402,901 B2 * | 7/2008 | Hatano ............... H01L 24/05 257/684 |
| 7,427,824 B2 | 9/2008 | Iwamoto et al. |
| 7,489,032 B2 | 2/2009 | Jobetto |
| 7,596,849 B1 | 10/2009 | Carpenter et al. |
| 7,619,347 B1 | 11/2009 | Bhattacharjee |
| 7,635,636 B2 | 12/2009 | McClure et al. |
| 7,714,535 B2 | 5/2010 | Yamazaki et al. |
| 7,749,882 B2 | 7/2010 | Kweon et al. |
| 7,790,543 B2 | 9/2010 | Abadeer et al. |
| 7,843,072 B1 | 11/2010 | Park et al. |
| 7,855,101 B2 | 12/2010 | Furman et al. |
| 7,868,419 B1 | 1/2011 | Kerr et al. |
| 7,910,405 B2 | 3/2011 | Okada et al. |
| 7,960,218 B2 | 6/2011 | Ma et al. |
| 8,004,089 B2 | 8/2011 | Jobetto |
| 8,183,151 B2 | 5/2012 | Lake |
| 8,420,447 B2 | 4/2013 | Tay et al. |
| 8,503,186 B2 | 8/2013 | Lin et al. |
| 8,643,148 B2 | 2/2014 | Lin et al. |
| 8,658,475 B1 | 2/2014 | Kerr |
| 8,664,044 B2 | 3/2014 | Jin et al. |
| 8,772,853 B2 | 7/2014 | Hong et al. |
| 8,791,532 B2 | 7/2014 | Graf et al. |
| 8,802,495 B2 | 8/2014 | Kim et al. |
| 8,803,242 B2 | 8/2014 | Marino et al. |
| 8,816,407 B2 | 8/2014 | Kim et al. |
| 8,835,978 B2 | 9/2014 | Mauder et al. |
| 8,906,755 B1 | 12/2014 | Hekmatshoartabari et al. |
| 8,921,990 B2 | 12/2014 | Park et al. |
| 8,927,968 B2 | 1/2015 | Cohen et al. |
| 8,941,248 B2 | 1/2015 | Lin et al. |
| 8,963,321 B2 | 2/2015 | Lenniger et al. |
| 8,983,399 B2 | 3/2015 | Kawamura et al. |
| 9,165,793 B1 | 10/2015 | Wang et al. |
| 9,214,337 B2 | 12/2015 | Carroll et al. |
| 9,349,700 B2 | 5/2016 | Hsieh et al. |
| 9,368,429 B2 | 6/2016 | Ma et al. |
| 9,461,001 B1 | 10/2016 | Tsai et al. |
| 9,520,428 B2 | 12/2016 | Fujimori |
| 9,530,709 B2 | 12/2016 | Leipold et al. |
| 9,613,831 B2 | 4/2017 | Morris et al. |
| 9,646,856 B2 | 5/2017 | Meyer et al. |
| 9,653,428 B1 | 5/2017 | Hiner et al. |
| 9,786,586 B1 | 10/2017 | Shih |
| 9,812,350 B2 | 11/2017 | Costa |
| 9,824,951 B2 | 11/2017 | Leipold et al. |
| 9,824,974 B2 | 11/2017 | Gao et al. |
| 9,859,254 B1 | 1/2018 | Yu et al. |
| 9,875,971 B2 | 1/2018 | Bhushan et al. |
| 9,941,245 B2 | 4/2018 | Skeete et al. |
| 10,134,837 B1 | 11/2018 | Fanelli et al. |
| 2001/0004131 A1 | 6/2001 | Masayuki et al. |

(56) References Cited

U.S. PATENT DOCUMENTS

| | | |
|---|---|---|
| 2002/0070443 A1 | 6/2002 | Mu et al. |
| 2002/0074641 A1 | 6/2002 | Towle et al. |
| 2002/0127769 A1 | 9/2002 | Ma et al. |
| 2002/0127780 A1 | 9/2002 | Ma et al. |
| 2002/0137263 A1 | 9/2002 | Towle et al. |
| 2002/0185675 A1 | 12/2002 | Furukawa |
| 2003/0207515 A1 | 11/2003 | Tan et al. |
| 2004/0021152 A1* | 2/2004 | Nguyen ............ H01L 29/7787 257/192 |
| 2004/0164367 A1 | 8/2004 | Park |
| 2004/0166642 A1 | 8/2004 | Chen et al. |
| 2004/0219765 A1 | 11/2004 | Reif et al. |
| 2005/0037595 A1 | 2/2005 | Nakahata |
| 2005/0077511 A1 | 4/2005 | Fitzergald |
| 2005/0079686 A1 | 4/2005 | Aigner et al. |
| 2005/0212419 A1 | 9/2005 | Vazan et al. |
| 2006/0057782 A1 | 3/2006 | Gardes et al. |
| 2006/0099781 A1* | 5/2006 | Beaumont ............ C30B 29/406 438/509 |
| 2006/0105496 A1 | 5/2006 | Chen et al. |
| 2006/0108585 A1 | 5/2006 | Gan et al. |
| 2006/0228074 A1 | 10/2006 | Lipson et al. |
| 2006/0261446 A1 | 11/2006 | Wood et al. |
| 2007/0020807 A1 | 1/2007 | Geefay et al. |
| 2007/0045738 A1 | 3/2007 | Jones et al. |
| 2007/0069393 A1 | 3/2007 | Asahi et al. |
| 2007/0075317 A1 | 4/2007 | Kato et al. |
| 2007/0121326 A1 | 5/2007 | Nall et al. |
| 2007/0158746 A1 | 7/2007 | Ohguro |
| 2007/0181992 A1 | 8/2007 | Lake |
| 2007/0190747 A1 | 8/2007 | Humpston et al. |
| 2007/0194342 A1 | 8/2007 | Kinzer |
| 2007/0252481 A1 | 11/2007 | Iwamoto et al. |
| 2007/0276092 A1 | 11/2007 | Kanae et al. |
| 2008/0050852 A1 | 2/2008 | Hwang et al. |
| 2008/0050901 A1 | 2/2008 | Kweon et al. |
| 2008/0164528 A1 | 7/2008 | Cohen et al. |
| 2008/0265978 A1 | 10/2008 | Englekirk |
| 2008/0272497 A1 | 11/2008 | Lake |
| 2008/0277800 A1 | 11/2008 | Hwang et al. |
| 2008/0315372 A1 | 12/2008 | Kuan et al. |
| 2009/0008714 A1 | 1/2009 | Chae |
| 2009/0010056 A1 | 1/2009 | Kuo et al. |
| 2009/0014856 A1 | 1/2009 | Knickerbocker |
| 2009/0090979 A1 | 4/2009 | Zhu et al. |
| 2009/0179266 A1 | 7/2009 | Abadeer et al. |
| 2009/0243097 A1 | 10/2009 | Koroku et al. |
| 2009/0261460 A1 | 10/2009 | Kuan et al. |
| 2009/0302484 A1 | 12/2009 | Lee et al. |
| 2010/0003803 A1 | 1/2010 | Oka et al. |
| 2010/0012354 A1 | 1/2010 | Hedin et al. |
| 2010/0029045 A1 | 2/2010 | Ramanathan et al. |
| 2010/0045145 A1 | 2/2010 | Tsuda |
| 2010/0081232 A1 | 4/2010 | Furman et al. |
| 2010/0081237 A1 | 4/2010 | Wong et al. |
| 2010/0109122 A1 | 5/2010 | Ding et al. |
| 2010/0120204 A1 | 5/2010 | Kunimoto |
| 2010/0127340 A1 | 5/2010 | Sugizaki |
| 2010/0173436 A1 | 7/2010 | Ouellet et al. |
| 2010/0200919 A1 | 8/2010 | Kikuchi |
| 2010/0314637 A1 | 12/2010 | Kim et al. |
| 2011/0003433 A1 | 1/2011 | Harayama et al. |
| 2011/0026232 A1 | 2/2011 | Lin et al. |
| 2011/0036400 A1 | 2/2011 | Murphy et al. |
| 2011/0062549 A1 | 3/2011 | Lin |
| 2011/0068433 A1 | 3/2011 | Kim et al. |
| 2011/0102002 A1 | 5/2011 | Riehl et al. |
| 2011/0171792 A1 | 7/2011 | Chang et al. |
| 2011/0272800 A1 | 11/2011 | Chino |
| 2011/0272824 A1 | 11/2011 | Pagaila |
| 2011/0294244 A1 | 12/2011 | Hattori et al. |
| 2012/0003813 A1 | 1/2012 | Chuang et al. |
| 2012/0045871 A1 | 2/2012 | Lee et al. |
| 2012/0068276 A1 | 3/2012 | Lin et al. |
| 2012/0094418 A1 | 4/2012 | Grama et al. |
| 2012/0098074 A1 | 4/2012 | Lin et al. |
| 2012/0104495 A1 | 5/2012 | Zhu et al. |
| 2012/0119346 A1 | 5/2012 | Im et al. |
| 2012/0153393 A1 | 6/2012 | Liang et al. |
| 2012/0168863 A1 | 7/2012 | Zhu et al. |
| 2012/0256260 A1 | 10/2012 | Cheng et al. |
| 2012/0292700 A1 | 11/2012 | Khakifirooz et al. |
| 2012/0299105 A1 | 11/2012 | Cai et al. |
| 2013/0001665 A1 | 1/2013 | Zhu et al. |
| 2013/0015429 A1 | 1/2013 | Hong et al. |
| 2013/0049205 A1 | 2/2013 | Meyer et al. |
| 2013/0099315 A1 | 4/2013 | Zhu et al. |
| 2013/0105966 A1 | 5/2013 | Kelkar et al. |
| 2013/0147009 A1 | 6/2013 | Kim |
| 2013/0155681 A1 | 6/2013 | Nall et al. |
| 2013/0196483 A1 | 8/2013 | Dennard et al. |
| 2013/0200456 A1 | 8/2013 | Zhu et al. |
| 2013/0280826 A1 | 10/2013 | Scanlan et al. |
| 2013/0299871 A1 | 11/2013 | Mauder et al. |
| 2014/0015131 A1 | 1/2014 | Meyer et al. |
| 2014/0035129 A1 | 2/2014 | Stuber et al. |
| 2014/0134803 A1 | 5/2014 | Kelly et al. |
| 2014/0168014 A1 | 6/2014 | Chih et al. |
| 2014/0197530 A1 | 7/2014 | Meyer et al. |
| 2014/0210314 A1 | 7/2014 | Bhattacharjee et al. |
| 2014/0219604 A1 | 8/2014 | Hackler, Sr. et al. |
| 2014/0252566 A1 | 9/2014 | Kerr et al. |
| 2014/0252567 A1 | 9/2014 | Carroll et al. |
| 2014/0264813 A1 | 9/2014 | Lin et al. |
| 2014/0264818 A1 | 9/2014 | Lowe, Jr. et al. |
| 2014/0306324 A1 | 10/2014 | Costa et al. |
| 2014/0327003 A1 | 11/2014 | Fuergut et al. |
| 2014/0327150 A1 | 11/2014 | Jung et al. |
| 2014/0346573 A1 | 11/2014 | Adam et al. |
| 2014/0356602 A1 | 12/2014 | Oh et al. |
| 2015/0015321 A1 | 1/2015 | Dribinsky et al. |
| 2015/0108666 A1 | 4/2015 | Engelhardt et al. |
| 2015/0115416 A1 | 4/2015 | Costa et al. |
| 2015/0130045 A1 | 5/2015 | Tseng et al. |
| 2015/0136858 A1 | 5/2015 | Finn et al. |
| 2015/0197419 A1 | 7/2015 | Cheng et al. |
| 2015/0235990 A1 | 8/2015 | Cheng et al. |
| 2015/0235993 A1 | 8/2015 | Cheng et al. |
| 2015/0243881 A1 | 8/2015 | Sankman et al. |
| 2015/0255368 A1 | 9/2015 | Costa |
| 2015/0262844 A1 | 9/2015 | Meyer et al. |
| 2015/0279789 A1 | 10/2015 | Mahajan et al. |
| 2015/0311132 A1 | 10/2015 | Kuo et al. |
| 2015/0364344 A1 | 12/2015 | Yu et al. |
| 2015/0380394 A1 | 12/2015 | Jang et al. |
| 2015/0380523 A1 | 12/2015 | Hekmatshoartabari et al. |
| 2016/0002510 A1 | 1/2016 | Champagne et al. |
| 2016/0079137 A1 | 3/2016 | Leipold et al. |
| 2016/0093580 A1 | 3/2016 | Scanlan et al. |
| 2016/0100489 A1 | 4/2016 | Costa et al. |
| 2016/0126111 A1 | 5/2016 | Leipold et al. |
| 2016/0126196 A1 | 5/2016 | Leipold et al. |
| 2016/0133591 A1 | 5/2016 | Hong et al. |
| 2016/0155706 A1 | 6/2016 | Yoneyama et al. |
| 2016/0284568 A1 | 9/2016 | Morris et al. |
| 2016/0284570 A1 | 9/2016 | Morris et al. |
| 2016/0343592 A1 | 11/2016 | Costa et al. |
| 2016/0343604 A1 | 11/2016 | Costa et al. |
| 2016/0347609 A1 | 12/2016 | Yu et al. |
| 2016/0362292 A1 | 12/2016 | Chang et al. |
| 2017/0024503 A1 | 1/2017 | Connelly |
| 2017/0032957 A1 | 2/2017 | Costa et al. |
| 2017/0033026 A1 | 2/2017 | Ho et al. |
| 2017/0053938 A1 | 2/2017 | Whitefield |
| 2017/0077028 A1 | 3/2017 | Maxim et al. |
| 2017/0098587 A1 | 4/2017 | Leipold et al. |
| 2017/0190572 A1 | 7/2017 | Pan et al. |
| 2017/0200648 A1 | 7/2017 | Lee et al. |
| 2017/0207350 A1 | 7/2017 | Leipold et al. |
| 2017/0263539 A1 | 9/2017 | Gowda et al. |
| 2017/0271200 A1 | 9/2017 | Costa |
| 2017/0323804 A1 | 11/2017 | Costa et al. |
| 2017/0323860 A1 | 11/2017 | Costa et al. |
| 2017/0334710 A1 | 11/2017 | Costa et al. |

(56) References Cited

U.S. PATENT DOCUMENTS

| | | |
|---|---|---|
| 2017/0358511 A1 | 12/2017 | Costa et al. |
| 2018/0019184 A1 | 1/2018 | Costa et al. |
| 2018/0019185 A1 | 1/2018 | Costa et al. |
| 2018/0044169 A1 | 2/2018 | Hatcher, Jr. et al. |
| 2018/0044177 A1 | 2/2018 | Vandemeer et al. |
| 2018/0047653 A1 | 2/2018 | Costa et al. |
| 2018/0076174 A1 | 3/2018 | Costa et al. |
| 2018/0138082 A1 | 5/2018 | Costa et al. |
| 2018/0145678 A1 | 5/2018 | Maxim et al. |
| 2018/0166358 A1 | 6/2018 | Costa et al. |
| 2018/0269188 A1 | 9/2018 | Yu et al. |
| 2019/0013254 A1 | 1/2019 | Costa et al. |
| 2019/0013255 A1 | 1/2019 | Costa et al. |
| 2019/0043812 A1 | 2/2019 | Leobandung |
| 2019/0074263 A1 | 3/2019 | Costa et al. |
| 2019/0074271 A1 | 3/2019 | Costa et al. |
| 2019/0172842 A1 | 6/2019 | Whitefield |
| 2019/0189599 A1 | 6/2019 | Baloglu et al. |
| 2019/0287953 A1 | 9/2019 | Moon et al. |
| 2019/0304910 A1 | 10/2019 | Fillion |
| 2020/0058541 A1 | 2/2020 | Konishi et al. |

FOREIGN PATENT DOCUMENTS

| | | |
|---|---|---|
| EP | 2996143 A1 | 3/2016 |
| JP | S505733 Y1 | 2/1975 |
| JP | H11-220077 A | 8/1999 |
| JP | 200293957 A | 3/2002 |
| JP | 2002252376 A | 9/2002 |
| JP | 2006005025 A | 1/2006 |
| JP | 2007227439 A | 9/2007 |
| JP | 2008235490 A | 10/2008 |
| JP | 2008279567 A | 11/2008 |
| JP | 2009026880 A | 2/2009 |
| JP | 2009530823 A | 8/2009 |
| JP | 2011243596 A | 12/2011 |
| WO | 2007074651 A1 | 7/2007 |
| WO | 2018083961 A1 | 5/2018 |
| WO | 2018125242 A1 | 7/2018 |

OTHER PUBLICATIONS

Notice of Allowance for U.S. Appl. No. 15/873,152, dated Dec. 10, 2019, 9 pages.

Non-Final Office Action for U.S. Appl. No. 16/527,702, dated Jan. 10, 2020, 10 pages.

Fiorenza, et al., "Detailed Simulation Study of a Reverse Embedded-SiGE Strained-Silicon MOSFET," IEEE Transactions on Electron Devices, vol. 55, Issue 2, Feb. 2008, pp. 640-648.

Fiorenza, et al., "Systematic study of thick strained silicon NMOSFETs for digital applications," International SiGE Technology and Device Meeting, May 2006, IEEE, 2 pages.

Huang, et al., "Carrier Mobility Enhancement in Strained Si-On-Insulator Fabricated by Wafer Bonding," Symposium on VLSI Technology, Digest of Technical Papers, 2001, pp. 57-58.

Nan, et al., "Effect of Germanium content on mobility enhancement for strained silicon FET," Student Conference on Research and Development, Dec. 2017, IEEE, pp. 154-157.

Sugii, Nobuyuki, et al., "Performance Enhancement of Strained-Si MOSFETs Fabricated on a Chemical-Mechanical-Polished SiGE Substrate," IEEE Transactions on Electron Devices, vol. 49, Issue 12, Dec. 2002, pp. 2237-2243.

Yin, Haizhou, et al., "Fully-depleted Strained-Si on Insulator NMOSFETs without Relaxed SiGe Buffers," International Electron Devices Meeting, Dec. 2003, San Francisco, California, IEEE, 4 pages.

Non-Final Office Action for U.S. Appl. No. 15/676,693, dated May 3, 2018, 14 pages.

Notice of Allowance for U.S. Appl. No. 15/789,107, dated May 18, 2018, 8 pages.

Final Office Action for U.S. Appl. No. 15/616,109, dated Apr. 19, 2018, 18 pages.

Notice of Allowance for U.S. Appl. No. 15/676,693, dated Jul. 20, 2018, 8 pages.

Notice of Allowance for U.S. Appl. No. 15/695,629, dated Jul. 11, 2018, 12 pages.

Notice of Allowance for U.S. Appl. No. 15/387,855, dated Aug. 10, 2018, 7 pages.

Notice of Allowance for U.S. Appl. No. 15/914,538, dated Aug. 1, 2018, 9 pages.

Notice of Allowance and Applicant-Initiated Interview Summary for U.S. Appl. No. 15/262,457, dated Sep. 28, 2018, 16 pages.

Corrected Notice of Allowance for U.S. Appl. No. 15/676,693, dated Aug. 29, 2018, 5 pages.

Final Office Action for U.S. Appl. No. 15/601,858, dated Nov. 26, 2018, 16 pages.

Non-Final Office Action for U.S. Appl. No. 15/945,418, dated Nov. 1, 2018, 13 pages.

First Office Action for Chinese Patent Application No. 201510746323.X, dated Nov. 2, 2018, 12 pages.

Advisory Action for U.S. Appl. No. 15/601,858, dated Jan. 22, 2019, 3 pages.

Notice of Allowance for U.S. Appl. No. 16/038,879, dated Jan. 9, 2019, 8 pages.

Notice of Allowance for U.S. Appl. No. 16/004,961, dated Jan. 11, 2019, 8 pages.

International Preliminary Report on Patentability for PCT/US2017/046744, dated Feb. 21, 2019, 11 pages.

International Preliminary Report on Patentability for PCT/US2017/046758, dated Feb. 21, 2019, 11 pages.

International Preliminary Report on Patentability for PCT/US2017/046779, dated Feb. 21, 2019, 11 pages.

Non-Final Office Action for U.S. Appl. No. 15/992,613, dated Feb. 27, 2019, 15 pages.

Non-Final Office Action for U.S. Appl. No. 15/695,579, dated Jan. 28, 2019, 8 pages.

Notice of Allowance for U.S. Appl. No. 15/992,639, dated May 9, 2019, 7 pages.

Notice of Allowance for U.S. Appl. No. 15/695,579, dated Mar. 20, 2019, 8 pages.

Notice of Allowance for U.S. Appl. No. 16/004,961, dated May 13, 2019, 8 pages.

Non-Final Office Action for U.S. Appl. No. 15/601,858, dated Apr. 17, 2019, 9 pages.

Tsai, Chun-Lin, et al., "Smart GaN platform; Performance & Challenges," IEEE International Electron Devices Meeting, 2017, 4 pages.

Tsai, Szu-Ping., et al., "Performance Enhancement of Flip-Chip Packaged AlGaAn/GaN HEMTs by Strain Engineering Design," IEEE Transcations on Electron Devices, vol. 63, Issue 10, Oct. 2016, pp. 3876-3881.

Final Office Action for U.S. Appl. No. 15/992,613, dated May 24, 2019, 11 pages.

Non-Final Office Action for U.S. Appl. No. 15/873,152, dated May 24, 2019, 11 pages.

Notice of Allowance for U.S. Appl. No. 16/168,327, dated Jun. 28, 2019, 7 pages.

Lin, Yueh, Chin, et al., "Enhancement-Mode GaN MIS-HEMTs With LaHfOx Gate Insulator for Power Application," IEEE Electronic Device Letters, vol. 38, Issue 8, 2017, 4 pages.

Shukla, Shishir, et al., "GaN-on-Si Switched Mode RF Power Amplifiers for Non-Constant Envelope Signals," IEEE Topical Conference on RF/Microwave Power Amplifiers for Radio and Wireless Applications, 2017, pp. 88-91.

International Search Report and Written Opinion for International Patent Application No. PCT/US19/25591, dated Jun. 21, 2019, 7 pages.

Notice of Reasons for Refusal for Japanese Patent Application No. 2015-180657, dated Jul. 9, 2019, 4 pages.

Notice of Allowance for U.S. Appl. No. 15/601,858, dated Aug. 16, 2019, 8 pages.

Advisory Action for U.S. Appl. No. 15/992,613, dated Jul. 29, 2019, 3 pages.

(56) References Cited

OTHER PUBLICATIONS

Final Office Action for U.S. Appl. No. 15/873,152, dated Aug. 8, 2019, 13 pages.
Notice of Allowance for U.S. Appl. No. 15/975,230, dated Jul. 22, 2019, 7 pages.
Notice of Allowance for U.S. Appl. No. 16/004,961, dated Aug. 28, 2019, 8 pages.
International Search Report and Written Opinion for International Patent Application No. PCT/US2019/034645, dated Sep. 19, 2019, 14 pages.
International Search Report and Written Opinion for International Patent Application No. PCT/US2019/034699, dated Oct. 29, 2019, 13 pages.
Notice of Allowance for U.S. Appl. No. 15/992,613, dated Sep. 23, 2019, 7 pages.
Non-Final Office Action for U.S. Appl. No. 16/204,214, dated Oct. 9, 2019, 15 pages.
Non-Final Office Action for U.S. Appl. No. 15/816,637, dated Oct. 31, 2019, 10 pages.
Advisory Action for U.S. Appl. No. 15/873,152, dated Oct. 11, 2019, 3 pages.
Notice of Allowance for U.S. Appl. No. 15/287,273, dated Jun. 30, 2017, 8 pages.
Corrected Notice of Allowability for U.S. Appl. No. 15/287,273, dated Jul. 21, 2017, 5 pages.
Supplemental Notice of Allowability for U.S. Appl. No. 15/287,273, dated Sep. 7, 2017, 5 pages.
Extended European Search Report for European Patent Application No. 15184861.1, dated Jan. 25, 2016, 6 pages.
Office Action of the Intellectual Property Office for Taiwanese Patent Application No. 104130224, dated Jun. 15, 2016, 9 pages.
Non-Final Office Action for U.S. Appl. No. 14/885,202, dated Apr. 14, 2016, 5 pages.
Final Office Action for U.S. Appl. No. 14/885,202, dated Sep. 27, 2016, 7 pages.
Advisory Action for U.S. Appl. No. 14/885,202, dated Nov. 29, 2016, 3 pages.
Notice of Allowance for U.S. Appl. No. 14/885,202, dated Jan. 27, 2017, 7 pages.
Notice of Allowance for U.S. Appl. No. 14/885,202, dated Jul. 24, 2017, 8 pages.
Notice of Allowance for U.S. Appl. No. 14/885,243, dated Aug. 31, 2016, 8 pages.
Non-Final Office Action for U.S. Appl. No. 12/906,689, dated May 27, 2011, 13 pages.
Non-Final Office Action for U.S. Appl. No. 12/906,689, dated Nov. 4, 2011, 20 pages.
Search Report for Japanese Patent Application No. 2011-229152, dated Feb. 22, 2013, 58 pages.
Office Action for Japanese Patent Application No. 2011-229152, dated May 10, 2013, 7 pages.
Final Rejection for Japanese Patent Application No. 2011-229152, dated Oct. 25, 2013, 2 pages.
International Search Report and Written Opinion for PCT/US2016/045809, dated Oct. 7, 2016, 11 pages.
Non-Final Office Action for U.S. Appl. No. 15/652,867, dated Oct. 10, 2017, 5 pages.
Bernheim et al., "Chapter 9: Lamination," Tools and Manufacturing Engineers Handbook (book), Apr. 1, 1996, Society of Manufacturing Engineers, p. 9-1.
Fillion R. et al., "Development of a Plastic Encapsulated Multichip Technology for High Volume, Low Cost Commercial Electronics," Electronic Components and Technology Conference, vol. 1, May 1994, IEEE, 5 pages.
Henawy, Mahmoud Al et al., "New Thermoplastic Polymer Substrate for Microstrip Antennas at 60 GHz," German Microwave Conference, Mar. 15-17, 2010, Berlin, Germany, IEEE, pp. 5-8.
International Search Report and Written Opinion for PCT/US2017/046744, dated Nov. 27, 2017, 17 pages.
International Search Report and Written Opinion for PCT/US2017/046758, dated Nov. 16, 2017, 19 pages.
International Search Report and Written Opinion for PCT/US2017/046779, dated Nov. 29, 2017, 17 pages.
Non-Final Office Action for U.S. Appl. No. 15/616,109, dated Oct. 23, 2017, 16 pages.
Corrected Notice of Allowability for U.S. Appl. No. 14/851,652, dated Oct. 20, 2017, 5 pages.
Final Office Action for U.S. Appl. No. 15/262,457, dated Dec. 19, 2017, 12 pages.
Supplemental Notice of Allowability and Applicant-Initiated Interview Summary for U.S. Appl. No. 15/287,273, dated Oct. 18, 2017, 6 pages.
Supplemental Notice of Allowability for U.S. Appl. No. 15/287,273, dated Nov. 2, 2017, 5 pages.
Non-Final Office Action for U.S. Appl. No. 15/491,064, dated Jan. 2, 2018, 9 pages.
Notice of Allowance for U.S. Appl. No. 14/872,910, dated Nov. 17, 2017, 11 pages.
Notice of Allowance for U.S. Appl. No. 15/648,082, dated Nov. 29, 2017, 8 pages.
Non-Final Office Action for U.S. Appl. No. 15/652,826, dated Nov. 3, 2017, 5 pages.
Notice of Allowance for U.S. Appl. No. 15/229,780, dated Oct. 3, 2017, 7 pages.
Supplemental Notice of Allowability for U.S. Appl. No. 15/287,273, dated Jan. 17, 2018, 5 pages.
Notice of Allowance for U.S. Appl. No. 15/498,040, dated Feb. 20, 2018, 8 pages.
Non-Final Office Action for U.S. Appl. No. 15/387,855, dated Jan. 16, 2018, 7 pages.
Non-Final Office Action for U.S. Appl. No. 15/795,915, dated Feb. 23, 2018, 6 pages.
International Preliminary Report on Patentability for PCT/US2016/045809, dated Feb. 22, 2018, 8 pages.
Advisory Action and Applicant-Initiated Interview Summary for U.S. Appl. No. 15/262,457, dated Feb. 28, 2018, 5 pages.
Supplemental Notice of Allowability for U.S. Appl. No. 15/287,273, dated Feb. 23, 2018, 5 pages.
Non-Final Office Action for U.S. Appl. No. 15/676,415, dated Mar. 27, 2018, 14 page.
Non-Final Office Action for U.S. Appl. No. 15/676,621, dated Mar. 26, 2018, 16 pages.
Notice of Allowance for U.S. Appl. No. 15/795,915, dated Jun. 15, 2018, 7 pages.
Final Office Action for U.S. Appl. No. 15/387,855, dated May 24, 2018, 9 pages.
Non-Final Office Action for U.S. Appl. No. 15/262,457, dated Apr. 19, 2018, 10 pages.
Notice of Allowance for U.S. Appl. No. 15/491,064, dated Apr. 30, 2018, 9 pages.
Non-Final Office Action for U.S. Appl. No. 15/601,858, dated Jun. 26, 2018, 12 pages.
Notice of Allowance for U.S. Appl. No. 15/616,109, dated Jul. 2, 2018, 7 pages.
Notice of Allowance for U.S. Appl. No. 15/676,621, dated Jun. 5, 2018, 8 pages.
Raskin, Jean-Pierre et al., "Substrate Crosstalk Reduction Using SOI Technology," IEEE Transactions on Electron Devices, vol. 44, No. 12, Dec. 1997, pp. 2252-2261.
Rong, B., et al., "Surface-Passivated High-Resistivity Silicon Substrates for RFICs," IEEE Electron Device Letters, vol. 25, No. 4, Apr. 2004, pp. 176-178.
Sherman, Lilli M., "Plastics that Conduct Heat," Plastics Technology Online, Jun. 2001, Retrieved May 17, 2016, http://www.ptonline.com/articles/plastics-that-conduct-heat, Gardner Business Media, Inc., 5 pages.
Tombak, A., et al., "High-Efficiency Cellular Power Amplifiers Based on a Modified LDMOS Process on Bulk Silicon and Silicon-On-Insulator Substrates with Integrated Power Management Circuitry," IEEE Transactions on Microwave Theory and Techniques, vol. 60, No. 6, Jun. 2012, pp. 1862-1869.

(56) References Cited

OTHER PUBLICATIONS

Yamanaka, A., et al., "Thermal Conductivity of High-Strength Polyetheylene Fiber and Applications for Cryogenic Use," International Scholarly Research Network, ISRN Materials Science, vol. 2011, Article ID 718761, May 25, 2011, 10 pages.
Non-Final Office Action for U.S. Appl. No. 13/852,648, dated Jul. 18, 2013, 20 pages.
Final Office Action for U.S. Appl. No. 13/852,648, dated Nov. 26, 2013, 21 pages.
Applicant-Initiated Interview Summary for U.S. Appl. No. 13/852,648, dated Jan. 27, 2014, 4 pages.
Advisory Action for U.S. Appl. No. 13/852,648, dated Mar. 7, 2014, 4 pages.
Notice of Allowance for U.S. Appl. No. 13/852,648, dated Jun. 16, 2014, 9 pages.
Notice of Allowance for U.S. Appl. No. 13/852,648, dated Sep. 26, 2014, 8 pages.
Notice of Allowance for U.S. Appl. No. 13/852,648, dated Jan. 22, 2015, 8 pages.
Non-Final Office Action for U.S. Appl. No. 13/852,648, dated Jun. 24, 2015, 20 pages.
Final Office Action for U.S. Appl. No. 13/852,648, dated Oct. 22, 2015, 20 pages.
Non-Final Office Action for U.S. Appl. No. 13/852,648, dated Feb. 19, 2016, 12 pages.
Final Office Action for U.S. Appl. No. 13/852,648, dated Jul. 20, 2016, 14 pages.
Non-Final Office Action for U.S. Appl. No. 14/315,765, dated Jan. 2, 2015, 6 pages.
Final Office Action for U.S. Appl. No. 14/315,765, dated May 11, 2015, 17 pages.
Advisory Action for U.S. Appl. No. 14/315,765, dated Jul. 22, 2015, 3 pages.
Non-Final Office Action for U.S. Appl. No. 14/260,909, dated Mar. 20, 2015, 20 pages.
Final Office Action for U.S. Appl. No. 14/260,909, dated Aug. 12, 2015, 18 pages.
Non-Final Office Action for U.S. Appl. No. 14/261,029, dated Dec. 5, 2014, 15 pages.
Notice of Allowance for U.S. Appl. No. 14/261,029, dated Apr. 27, 2015, 10 pages.
Corrected Notice of Allowability for U.S. Appl. No. 14/261,029, dated Nov. 17, 2015, 5 pages.
Non-Final Office Action for U.S. Appl. No. 14/529,870, dated Feb. 12, 2016, 14 pages.
Notice of Allowance for U.S. Appl. No. 14/529,870, dated Jul. 15, 2016, 8 pages.
Non-Final Office Action for U.S. Appl. No. 15/293,947, dated Apr. 7, 2017, 12 pages.
Notice of Allowance for U.S. Appl. No. 15/293,947, dated Aug. 14, 2017, 7 pages.
Non-Final Office Action for U.S. Appl. No. 14/715,830, dated Apr. 13, 2016, 16 pages.
Final Office Action for U.S. Appl. No. 14/715,830, dated Sep. 6, 2016, 13 pages.
Advisory Action for U.S. Appl. No. 14/715,830, dated Oct. 31, 2016, 6 pages.
Notice of Allowance for U.S. Appl. No. 14/715,830, dated Feb. 10, 2017, 8 pages.
Notice of Allowance for U.S. Appl. No. 14/715,830, dated Mar. 2, 2017, 8 pages.
Non-Final Office Action for U.S. Appl. No. 14/851,652, dated Oct. 7, 2016, 10 pages.
Notice of Allowance for U.S. Appl. No. 14/851,652, dated Apr. 11, 2017, 9 pages.
Corrected Notice of Allowance for U.S. Appl. No. 14/851,652, dated Jul. 24, 2017, 6 pages.
Corrected Notice of Allowance for U.S. Appl. No. 14/851,652, dated Sep. 6, 2017, 5 pages.
Notice of Allowance for U.S. Appl. No. 14/959,129, dated Oct. 11, 2016, 8 pages.
Non-Final Office Action for U.S. Appl. No. 15/173,037, dated Jan. 10, 2017, 8 pages.
Final Office Action for U.S. Appl. No. 15/173,037, dated May 2, 2017, 13 pages.
Advisory Action for U.S. Appl. No. 15/173,037, dated Jul. 20, 2017, 3 pages.
Notice of Allowance for U.S. Appl. No. 15/173,037, dated Aug. 9, 2017, 7 pages.
Non-Final Office Action for U.S. Appl. No. 15/085,185, dated Feb. 15, 2017, 10 pages.
Non-Final Office Action for U.S. Appl. No. 15/085,185, dated Jun. 6, 2017, 5 pages.
Non-Final Office Action for U.S. Appl. No. 15/229,780, dated Jun. 30, 2017, 12 pages.
Non-Final Office Action for U.S. Appl. No. 15/262,457, dated Aug. 7, 2017, 10 pages.
Notice of Allowance for U.S. Appl. No. 15/408,560, dated Sep. 25, 2017, 8 pages.
Notice of Allowance for U.S. Appl. No. 15/287,202, dated Aug. 25, 2017, 11 pages.
Non-Final Office Action for U.S. Appl. No. 15/353,346, dated May 23, 2017, 15 pages.
Notice of Allowance for U.S. Appl. No. 15/353,346, dated Sep. 25, 2017, 9 pages.
Dhar, S. et al., "Electron Mobility Model for Strained-Si Devices," IEEE Transactions on Electron Devices, vol. 52, No. 4, Apr. 2005, IEEE, pp. 527-533.
Notice of Allowance for U.S. Appl. No. 16/038,879, dated Apr. 15, 2020, 9 pages.
Notice of Allowance for U.S. Appl. No. 15/816,637, dated Apr. 2, 2020, 8 pages.
Corrected Notice of Allowability for U.S. Appl. No. 15/695,579, dated Feb. 5, 2020, 5 pages.
Corrected Notice of Allowability for U.S. Appl. No. 15/695,579, dated Apr. 1, 2020, 4 pages.
Notice of Allowance for U.S. Appl. No. 16/527,702, dated Apr. 9, 2020, 8 pages.
Final Office Action for U.S. Patent Application No. 16/204,214, dated Mar. 6, 2020, 14 pages.
Advisory Action for U.S. Appl. No. 16/204,214, dated Apr. 15, 2020, 3 pages.
Decision of Rejection for Japanese Patent Application No. 2015-180657, dated Mar. 17, 2020, 4 pages.
Intention to Grant for European Patent Application No. 17757646.9, dated Feb. 27, 2020, 55 pages.
International Search Report and Written Opinion for International Patent Application No. PCT/US2019/063460, dated Feb. 25, 2020, 14 pages.
International Search Report and Written Opinion for International Patent Application No. PCT/US2019/055317, dated Feb. 6, 2020, 17 pages.
International Search Report and Written Opinion for International Patent Application No. PCT/US2019/055321, dated Jan. 27, 2020, 23 pages.
Ali, K. Ben et al., "RF SOI CMOS Technology on Commercial Trap-Rich High Resistivity SOI Wafer," 2012 IEEE International SOI Conference (SOI), Oct. 1-4, 2012, Napa, California, IEEE, 2 pages.
Anderson, D.R., "Thermal Conductivity of Polymers," Sandia Corporation, Mar. 8, 1966, pp. 677-690.
Author Unknown, "96% Alumina, thick-film, as fired," MatWeb, Date Unknown, date accessed Apr. 6, 2016, 2 pages, http://www.matweb.com/search/DataSheet.aspx?MatGUID=3996a734395a4870a9739076918c4297&ckck=1.
Author Unknown, "CoolPoly D5108 Thermally Conductive Polyphenylene Sulfide (PPS)," Cool Polymers, Inc., Aug. 8, 2007, 2 pages.
Author Unknown, "CoolPoly D5506 Thermally Conductive Liquid Crystalline Polymer (LCP)," Cool Polymers, Inc., Dec. 12, 2013, 2 pages.

(56) References Cited

OTHER PUBLICATIONS

Author Unknown, "CoolPoly D-Series—Thermally Conductive Dielectric Plastics," Cool Polymers, Retrieved Jun. 24, 2013, http://coolpolymers.com/dseries.asp, 1 page.

Author Unknown, "CoolPoly E2 Thermally Conductive Liquid Crystalline Polymer (LCP)," Cool Polymers, Inc., Aug. 8, 2007, http://www.coolpolymers.com/Files/DS/Datasheet_e2.pdf, 1 page.

Author Unknown, "CoolPoly E3605 Thermally Conductive Polyamide 4,6 (PA 4,6)," Cool Polymers, Inc., Aug. 4, 2007, 1 page, http://www.coolpolymers.com/Files/DS/Datasheet_e3605.pdf.

Author Unknown, "CoolPoly E5101 Thermally Conductive Polyphenylene Sulfide (PPS)," Cool Polymers, Inc., Aug. 27, 2007, 1 page, http://www.coolpolymers.com/Files/DS/Datasheet_e5101.pdf.

Author Unknown, "CoolPoly E5107 Thermally Conductive Polyphenylene Sulfide (PPS)," Cool Polymers, Inc., Aug. 8, 2007, 1 page, http://coolpolymers.com/Files/DS/Datasheet_e5107.pdf.

Author Unknown, "CoolPoly Selection Tool," Cool Polymers, Inc., 2006, 1 page, http://www.coolpolymers.com/select.asp?Application=Substrates+%26+Electcronic_Packaging.

Author Unknown, "CoolPoly Thermally Conductive Plastics for Dielectric Heat Plates," Cool Polymers, Inc., 2006, 2 pages, http://www.coolpolymers.com/heatplate.asp.

Author Unknown, "CoolPoly Thermally Conductive Plastics for Substrates and Electronic Packaging," Cool Polymers, Inc., 2005, 1 page.

Author Unknown, "Electrical Properties of Plastic Materials," Professional Plastics, Oct. 28, 2011, http://www.professionalplastics.com/professionalplastics/ElectricalPropertiesofPlastics.pdf, accessed Dec. 18, 2014, 4 pages.

Author Unknown, "Fully Sintered Ferrite Powders," Powder Processing and Technology, LLC, Date Unknown, 1 page.

Author Unknown, "Heat Transfer," Cool Polymers, Inc., 2006, http://www.coolpolymers.com/heattrans.html, 2 pages.

Author Unknown, "Hysol UF3808," Henkel Corporation, Technical Data Sheet, May 2013, 2 pages.

Author Unknown, "PolyOne Therma-Tech™ LC-5000C TC LCP," MatWeb, Date Unknown, date accessed Apr. 6, 2016, 2 pages, http://www.matweb.com/search/datasheettext.aspx?matguid=89754e8bb26148d083c5ebb05a0cbff1.

Author Unknown, "Sapphire Substrate," from CRC Handbook of Chemistry and Physics, Date Unknown, 1 page.

Author Unknown, "Thermal Properties of Plastic Materials," Professional Plastics, Aug. 21, 2010, http://www.professionalplastics.com/professionalplastics/ThermalPropertiesofPlasticMaterials.pdf, accessed Dec. 18, 2014, 4 pages.

Author Unknown, "Thermal Properties of Solids," PowerPoint Presentation, No Date, 28 slides, http://www.phys.huji.ac.il/Phys_Hug/Lectures/77602/PHONONS_2_thermal.pdf.

Author Unknown, "Thermal Resistance & Thermal Conductance," C-Therm Technologies Ltd., accessed Sep. 19, 2013, 4 pages, http://www.ctherm.com/products/tci_thermal_conductivity/helpful_links_tools/thermal_resistance_thermal_conductance/.

Author Unknown, "The Technology: AKHAN's Approach and Solution: The Miraj Diamond™ Platform," 2015, accessed Oct. 9, 2016, http://www.akhansemi.com/technology.html#the-miraj-diamond-plafform, 5 pages.

Beck, D., et al., "CMOS on FZ-High Resistivity Substrate for Monolithic Integration of SiGe-RF-Circuitry and Readout Electronics," IEEE Transactions on Electron Devices, vol. 44, No. 7, Jul. 1997, pp. 1091-1101.

Botula, A., et al., "A Thin-Film SOI 180nm CMOS RF Switch Technology," IEEE Topical Meeting on Silicon Monolithic Integrated Circuits in RF Systems, (SiRF '09), Jan. 2009, pp. 1-4.

Carroll, M., et al., "High-Resistivity SOI CMOS Cellular Antenna Switches," Annual IEEE Compound Semiconductor Integrated Circuit Symposium, (CISC 2009), Oct. 2009, pp. 1-4.

Colinge, J.P., et al., "A Low-Voltage, Low-Power Microwave SOI MOSFET," Proceedings of 1996 IEEE International SOI Conference, Oct. 1996, pp. 128-129.

Costa, J. et al., "Integrated MEMS Switch Technology on SOI-CMOS," Proceedings of Hilton Head Workshop: A Solid-State Sensors, Actuators and Microsystems Workshop, Jun. 1-5, 2008, Hilton Head Island, SC, IEEE, pp. 900-903.

Costa, J. et al., "Silicon RFCMOS SOI Technology with Above-IC MEMS Integration for Front End Wireless Applications," Bipolar/BiCMOS Circuits and Technology Meeting, 2008, BCTM 2008, IEEE, pp. 204-207.

Costa, J., "RFCMOS SOI Technology for 4G Reconfigurable RF Solutions," Session WEC1-2, Proceedings of the 2013 IEEE International Microwave Symposium, 4 pages.

Esfeh, Babak Kazemi et al., "RF Non-Linearities from Si-Based Substrates," 2014 International Workshop on Integrated Nonlinear Microwave and Millimetre-wave Circuits (INMMiC), Apr. 2-4, 2014, IEEE, 3 pages.

Finne, R. M. et al., "A Water-Amine-Complexing Agent System for Etching Silicon," Journal of The Electrochemical Society, vol. 114, No. 9, Sep. 1967, pp. 965-970.

Gamble, H. S. et al., "Low-Loss CPW Lines on Surface Stabilized High-Resistivity Silicon," IEEE Microwave and Guided Wave Letters, vol. 9, No. 10, Oct. 1999, pp. 395-397.

Huang, Xingyi, et al., "A Review of Dielectric Polymer Composites with High Thermal Conductivity," IEEE Electrical Insulation Magazine, vol. 27, No. 4, Jul./Aug. 2011, pp. 8-16.

Joshi, V. et al., "MEMS Solutions in RF Applications," 2013 IEEE SOI-3D-Subthreshold Microelectronics Technology Unified Conference (S3S), Oct. 2013, IEEE, 2 pages.

Jung, Boo Yang, et al., "Study of FCMBGA with Low CTE Core Substrate," 2009 Electronic Components and Technology Conference, May 2009, pp. 301-304.

Kerr, D.C., et al., "Identification of RF Harmonic Distortion on Si Substrates and Its Reduction Using a Trap-Rich Layer," IEEE Topical Meeting on Silicon Monolithic Integrated Circuits in RF Systems, (SiRF 2008), Jan. 2008, pp. 151-154.

Lederer, D., et al., "New Substrate Passivation Method Dedicated to HR SOI Wafer Fabrication with Increased Substrate Resistivity," IEEE Electron Device Letters, vol. 26, No. 11, Nov. 2005, pp. 805-807.

Lederer, Dimitri et al., "Substrate loss mechanisms for microstrip and CPW transmission lines on lossy silicon wafers," Solid-State Electronics, vol. 47, No. 11, Nov. 2003, pp. 1927-1936.

Lee, Kwang Hong et al., "Integration of III-V materials and Si-CMOS through double layer transfer process," Japanese Journal of Applied Physics, vol. 54, Jan. 2015, pp. 030209-1 to 030209-5.

Lee, Tzung-Yin, et al., "Modeling of SOI FET for RF Switch Applications," IEEE Radio Frequency Integrated Circuits Symposium, May 23-25, 2010, Anaheim, CA, IEEE, pp. 479-482.

Lu, J.Q., et al., "Evaluation Procedures for Wafer Bonding and Thinning of Interconnect Test Structures for 3D ICs," Proceedings of the IEEE 2003 International Interconnect Technology Conference, Jun. 2-4, 2003, pp. 74-76.

Mamunya, Ye.P., et al., "Electrical and Thermal Conductivity of Polymers Filled with Metal Powders," European Polymer Journal, vol. 38, 2002, pp. 1887-1897.

Mansour, Raafat R., "RF MEMS-CMOS Device Integration," IEEE Microwave Magazine, vol. 14, No. 1, Jan. 2013, pp. 39-56.

Mazuré, C. et al., "Advanced SOI Substrate Manufacturing," 2004 IEEE International Conference on Integrated Circuit Design and Technology, 2004, IEEE, pp. 105-111.

Micak, R. et al., "Photo-Assisted Electrochemical Machining of Micromechanical Structures," Proceedings of Micro Electro Mechanical Systems, Feb. 7-10, 1993, Fort Lauderdale, FL, IEEE, pp. 225-229.

Morris, Art, "Monolithic Integration of RF-MEMS within CMOS," 2015 International Symposium on VLSI Technology, Systems and Application (VLSI-TSA), Apr. 27-29, 2015, IEEE, 2 pages.

Niklaus, F., et al., "Adhesive Wafer Bonding," Journal of Applied Physics, vol. 99, No. 3, Mar. 11, 2001 (2006), 28 pages.

Parthasarathy, S., et al., "RF SOI Switch FET Design and Modeling Tradeoffs for GSM Applications," 2010 23rd International Conference on VLSI Design, (VLSID '10), Jan. 2010, pp. 194-199.

(56) References Cited

OTHER PUBLICATIONS

Raskin, J.P., et al., "Coupling Effects in High-Resistivity SIMOX Substrates for VHF and Microwave Applications," Proceedings of 1995 IEEE International SOI Conference, Oct. 1995, pp. 62-63.
Quayle Action for U.S. Appl. No. 16/703,251, filed Jun. 26, 2020, 5 pages.
Notice of Allowance for U.S. Appl. No. 15/873,152, dated May 11, 2020, 8 pages.
Corrected Notice of Allowability for U.S. Appl. No. 15/695,579, dated May 20, 2020, 4 pages.
Notice of Allowability for U.S. Appl. No. 15/695,579, dated Jun. 25, 2020, 4 pages.
Notice of Allowance for U.S. Appl. No. 16/004,961, dated Apr. 30, 2020, 8 pages.
Non-Final Office Action for U.S. Appl. No. 16/374,125, dated Jun. 26, 2020, 12 pages.
Non-Final Office Action for U.S. Appl. No. 16/390,496, dated Jul. 10, 2020, 17 pages.
Non-Final Office Action for U.S. Appl. No. 16/204,214, dated May 19, 2020, 15 pages.
Non-Final Office Action for U.S. Appl. No. 16/454,687, dated May 15, 2020, 14 pages.
Non-Final Office Action for U.S. Appl. No. 16/454,809, dated May 15, 2020, 12 pages.
Welser, J. et al., "Electron Mobility Enhancement in Strained-Si N-Type Metal-Oxide-Semiconductor Field-Effect Transistors," IEEE Electron Device Letters, vol. 15, No. 3, Mar. 1994, IEEE, pp. 100-102.
Examination Report for European Patent Application No. 16751791.1, dated Apr. 30, 2020, 15 pages.
Notification of Reasons for Refusal for Japanese Patent Application No. 2018-526613, dated May 11, 2020, 6 pages.
Examination Report for Singapore Patent Application No. 11201901193U, dated May 26, 2020, 6 pages.
International Search Report and Written Opinion for International Patent Application No. PCT/US2020/014662, dated May 7, 2020, 18 pages.
International Search Report and Written Opinion for International Patent Application No. PCT/US2020/014665, dated May 13, 2020, 17 pages.
International Search Report and Written Opinion for International Patent Application No. PCT/US2020/014666, dated Jun. 4, 2020, 18 pages.
International Search Report and Written Opinion for International Patent Application No. PCT/US2020/014667, dated May 18, 2020, 14 pages.
International Search Report and Written Opinion for International Patent Application No. PCT/US2020/014669, dated Jun. 4, 2020, 15 pages.
Notice of Allowance for U.S. Appl. No. 16/703,251, dated Aug. 27, 2020, 8 pages.
Notice of Allowance for U.S. Appl. No. 16/454,687, dated Aug. 14, 2020, 7 pages.
Final Office Action for U.S. Appl. No. 16/454,809, dated Aug. 21, 2020, 12 pages.
Decision to Grant for Japanese Patent Application No. 2018-526613, dated Aug. 17, 2020, 5 pages.
International Preliminary Report on Patentability for International Patent Application No. PCT/US2019/025591, dated Oct. 15, 2020, 6 pages.
Notice of Allowance for U.S. Appl. No. 16/527,702, dated Nov. 13, 2020, 8 pages.
Non-Final Office Action for U.S. Appl. No. 16/426,527, dated Nov. 20, 2020, 7 pages.
Advisory Action for U.S. Appl. No. 16/454,809, dated Oct. 23, 2020, 3 pages.
Non-Final Office Action for U.S. Appl. No. 16/427,019, dated Nov. 19, 2020, 19 pages.

* cited by examiner

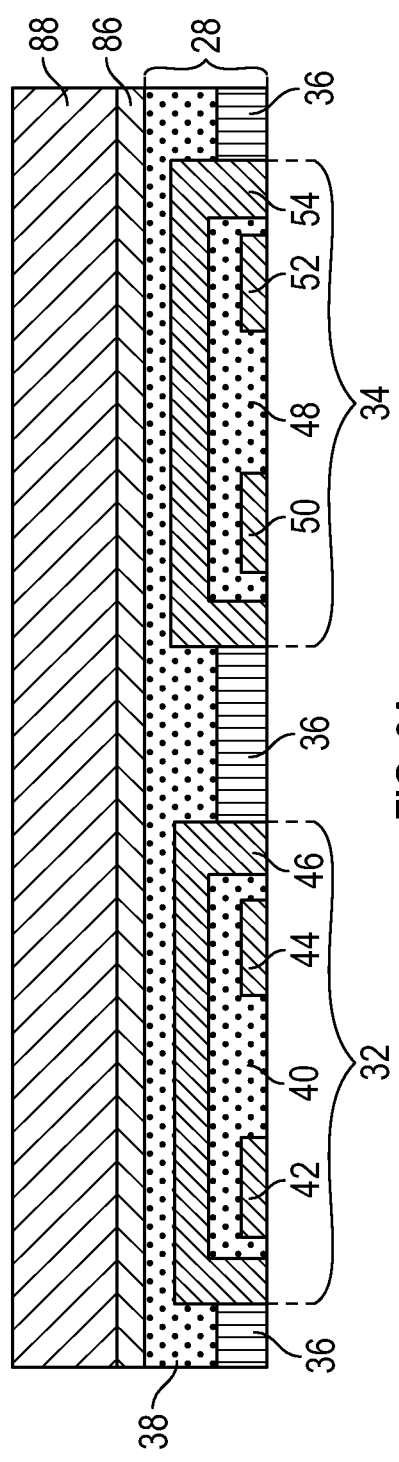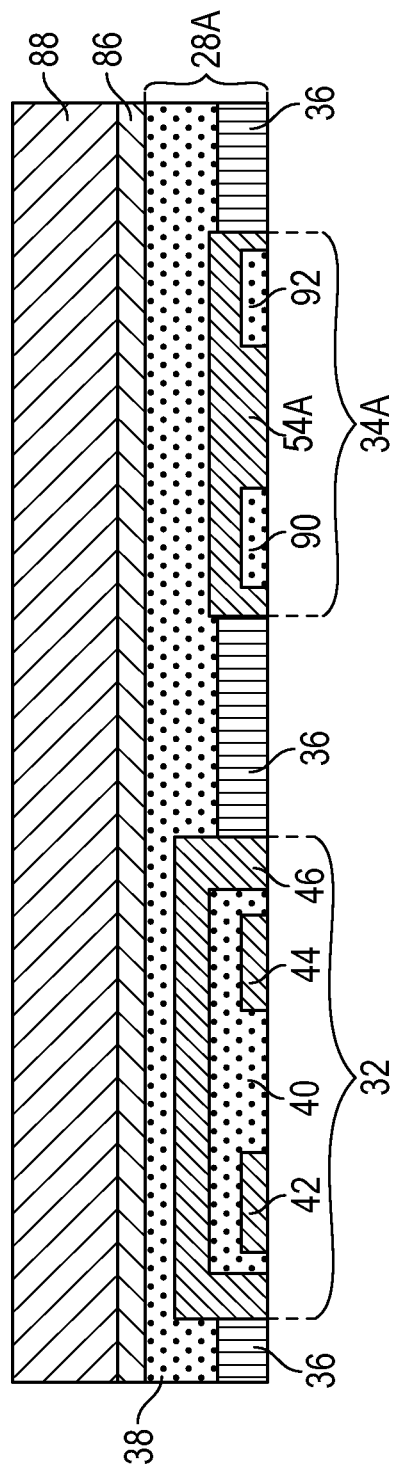

BULK CMOS DEVICES WITH ENHANCED PERFORMANCE AND METHODS OF FORMING THE SAME UTILIZING BULK CMOS PROCESS

RELATED APPLICATIONS

This application claims the benefit of provisional patent application Ser. No. 62/649,351, filed Mar. 28, 2018, the disclosure of which is hereby incorporated herein by reference in its entirety.

FIELD OF THE DISCLOSURE

The present disclosure relates to a bulk complementary-metal-oxide-semiconductor (CMOS) device and a process for making the same, and more particularly to a bulk CMOS device with enhanced thermal and electrical performance, and a die-level packaging process to provide the bulk CMOS device with enhanced performance.

BACKGROUND

The wide utilization of cellular and wireless devices drives the rapid development of radio frequency (RF) technologies. The substrates on which bulk CMOS devices are fabricated play an important role in achieving high level performance in the RF technologies. Fabrications of the bulk CMOS devices on conventional silicon handle substrates may benefit from low cost of silicon materials, a large scale capacity of wafer production, well-established semiconductor design tools, and well-established semiconductor manufacturing techniques.

Despite the benefits of using conventional silicon handle substrates for the bulk CMOS device fabrications, it is well known in the industry that the conventional silicon handle substrates may have two undesirable properties for the bulk CMOS devices: harmonic distortion and low resistivity values. The harmonic distortion is a critical impediment to achieve high level linearity in the bulk CMOS devices built over silicon handle substrates. In addition, high speed and high performance transistors are more densely integrated in bulk CMOS devices. Consequently, the amount of heat generated by the bulk CMOS devices will increase significantly due to the large number of transistors integrated in the bulk CMOS devices, the large amount of power passing through the transistors, and/or the high operation speed of the transistors. Accordingly, it is desirable to package the bulk CMOS devices in a configuration for better heat dissipation.

To accommodate the increased heat generation of the bulk CMOS devices and to reduce deleterious harmonic distortion of the bulk CMOS devices, it is therefore an object of the present disclosure to provide an improved packaging process for enhanced thermal and electrical performance. Further, there is also a need to enhance the performance of the bulk CMOS devices without increasing the package size.

SUMMARY

The present disclosure relates to a bulk complementary-metal-oxide-semiconductor (CMOS) device with enhanced thermal and electrical performance, and a process for making the same. The disclosed bulk CMOS device includes a device substrate having a top surface, a thinned device die with a device region and a number of bump structures, a first mold compound, and a second mold compound. The device region of the thinned device die includes a back-end-of-line (BEOL) portion with a number of connecting layers and a front-end-of-line (FEOL) portion residing over the BEOL portion. The FEOL portion includes a contact layer and an active layer that resides over the contact layer and has a first component cell. The bump structures are formed at a bottom surface of the BEOL portion and coupled to the top surface of the device substrate. Herein, the bump structures are electrically coupled to the FEOL portion via certain ones of the connecting layers. The first mold compound resides over the top surface of the device substrate, surrounds the thinned device die, and extends vertically beyond the thinned device die to define an opening over the thinned device die and within the first mold compound, wherein a top surface of the thinned device is at the bottom of the opening. The second mold compound substantially fills the opening and is in contact with the top surface of the thinned device. There is no silicon material, which has a resistivity between 5 Ohm-cm and 30000 Ohm-cm, between the second mold compound and the active layer of the thinned device.

In one embodiment of the bulk CMOS device, the active layer further includes isolation sections surrounding the first component cell.

In one embodiment of the bulk CMOS device, the first component cell is configured to provide an N-type field-effect transistor (NFET), and includes a P-well with an N-source and an N-drain, and an N-well encapsulating the P-well and surrounded by the isolation sections. The N-well is doped with an N-dopant having a density more than 1E15 cm-3. The active layer further includes a P-type passive section over both the first component cell and the isolation sections.

In one embodiment of the bulk CMOS device, the first component cell is configured to provide a P-type field-effect transistor (PFET) and includes an N-well with a P-source and a P-drain. Herein, the N-well is doped with an N-dopant having a density between 1E14 cm-3 and 1E19 cm-3, and is surrounded by the isolation sections. The active layer further includes a P-type passive section over both the first component cell and the isolation sections.

In one embodiment of the bulk CMOS device, the active layer further includes a second component cell and isolation sections that separate the first component cell from the second component cell. Herein, the first component cell and the second component cell are electrically coupled by one of the connecting layers within the BEOL portion.

In one embodiment of the bulk CMOS device, the first component cell is configured to provide a first NFET and the second component cell is configured to provide a second NFET. The first component cell includes a first P-well with a first N-source and a first N-drain, and a first N-well encapsulating the first P-well. The second component cell includes a second P-well with a second N-source and a second N-drain, and a second N-well encapsulating the second P-well. The first N-well and the second N-well are doped with an N-dopant having a density more than 1E15 cm-3. The isolation sections reside between first N-well of the first component cell and the second N-well of the second component cell. The first N-source of the first component cell is electrically coupled to the second N-drain of the second component cell by one of the connecting layers within the BEOL portion. The active layer further includes a P-type passive section over the first component cell, the second component cell, and the isolation sections.

In one embodiment of the bulk CMOS device, the thinned device die further includes an interfacial layer directly over the active layer and within the opening. Herein, the interfacial layer is formed of silicon germanium (SiGe) or silicon with a boron dopant having a density greater than 1E16 cm-3. A top surface of the interfacial layer is the top surface of the thinned device die, and the second mold compound is in contact with the interfacial layer.

In one embodiment of the bulk CMOS device, a top surface of the active layer is the top surface of the thinned device die, such that the second mold compound is in contact with the top surface of the active layer.

In one embodiment of the bulk CMOS device, the second mold compound has a thermal conductivity greater than 1 W/m·K.

In one embodiment of the bulk CMOS device, the second mold compound has a dielectric constant less than 8.

In one embodiment of the bulk CMOS device, the first mold compound and the second mold compound have a dielectric constant between 3 and 5.

According to an exemplary process, a precursor package, which includes a device substrate, a first mold compound, and a device die with a device region, an interfacial layer, a bulk silicon handle substrate, and a number of bump structures, is firstly provided. The device region of the device die includes a BEOL portion with a number of connecting layers and a FEOL portion residing over the BEOL portion. The FEOL portion includes a contact layer and an active layer that resides over the contact layer and has a first component cell. The bump structures are formed at a bottom surface of the BEOL portion and coupled to the device substrate. Herein the bump structures are electrically coupled to the FEOL portion via certain ones the connecting layers within the BEOL portion. The interfacial layer resides over the active layer and is formed of SiGe or silicon with a boron dopant having a density greater than 1E16 cm-3. The bulk silicon handle substrate resides over the interfacial layer. The first mold compound resides over the device substrate to encapsulate the device die. Next, the first mold compound is thinned down to expose the bulk silicon handle substrate. The bulk silicon handle substrate is then removed completely to provide a thinned device die from the device die, and form an opening within the first mold compound and over the thinned device die. A second mold compound is applied to substantially fill the opening and reside directly over the thinned device die.

According to another embodiment, the exemplary process further includes removing the interfacial layer before applying the second mold compound. Herein, the active layer is in contact with the second mold compound after the second mold compound is applied.

In one embodiment of the exemplary process, the second mold compound is in contact with the interfacial layer after the second mold compound is applied.

In one embodiment of the exemplary process, providing the precursor package starts with providing an initial wafer that includes a silicon epitaxial layer, the interfacial layer over the silicon epitaxial layer, and the bulk silicon handle substrate over the interfacial layer. The active layer is then formed from the silicon epitaxial layer, and underneath the interfacial layer. Next, the contact layer is formed underneath the active layer to complete the FEOL portion. The formation of the BEOL portion underneath the FEOL portion is followed. Then, the bump structures are formed at the bottom surface of BEOL portion to complete the device die. The device die is mounted to the device substrate, where the bump structures at the bottom surface of the BEOL portion are attached to the device substrate. Lastly, the first mold compound is applied over the device substrate to encapsulate the device die.

In one embodiment of the exemplary process, the interfacial layer is formed of silicon with a boron dopant having a density greater than 1E16 cm-3, and the bulk silicon handle substrate is removed by a wet etching process or a dry etching process.

In one embodiment of the exemplary process, the interfacial layer is formed of SiGe with a Ge concentration greater than 25%, and the bulk silicon handle substrate is removed by a wet etching process or a dry etching process.

In one embodiment of the exemplary process, the interfacial layer is formed of SiGe, and the bulk silicon handle substrate is removed by a dry etching process.

In one embodiment of the exemplary process, the active layer of the FEOL portion further includes a second component cell and isolation sections that separate the first component cell from the second component cell.

In one embodiment of the exemplary process, the first component cell is configured to provide a first NFET and the second component cell is configured to provide a second NFET. The first component cell includes a first P-well with a first N-source and a first N-drain, and a first N-well encapsulating the first P-well. The second component cell includes a second P-well with a second N-source and a second N-drain, and a second N-well encapsulating the second P-well. The first N-well and the second N-well are doped with an N-dopant having a density more than 1E15 cm-3. The isolation sections reside between first N-well of the first component cell and the second N-well of the second component cell. The first N-source of the first component cell is electrically coupled to the second N-drain of the second component cell by one of the connecting layers within the BEOL portion. The active layer further includes a P-type passive section over the first component cell, the second component, and the isolation sections.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 1 shows an exemplary bulk complementary-metal-oxide-semiconductor (CMOS) device with enhanced thermal and electrical performance according to one embodiment of the present disclosure.

FIGS. 2-12 provide an exemplary die-level packaging process that illustrates steps to fabricate the exemplary bulk CMOS device shown in FIG. 1.

It will be understood that for clear illustrations, FIGS. 1-12 may not be drawn to scale.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

With the looming shortage of conventional radio frequency silicon on insulator (RFSOI) wafers expected in the coming years, alternative technologies are being devised to get around the need for high resistivity using silicon wafers, the trap rich layer formation, and smart-cut SOI wafer process. One of these alternative technologies is a bulk complementary metal-oxide-semiconductor (CMOS) technology on a high resistivity silicon handle substrate and a buried N-well. However, the bulk CMOS technology will also suffer from the deleterious distortion effects due to the silicon substrate, similar to what is observed in an RFSOI technology. In addition, the high resistivity silicon substrate required in the bulk CMOS technology will be in short supply for the near future. The present disclosure, which relates to a bulk CMOS device with enhanced thermal and electrical performance, and a die-level packaging process to provide the bulk CMOS device with enhanced performances, is based on a bulk CMOS technology with low-cost low resistivity silicon substrate.

FIG. 1 shows an exemplary bulk CMOS device 10, which is formed from a bulk initial wafer including a silicon epitaxial layer, a low-cost low resistivity silicon handle substrate, and an interfacial layer in-between (processing details are described in following paragraphs), according to one embodiment of the present disclosure. The exemplary bulk CMOS device 10 includes a device substrate 12, a thinned device die 14, a first mold compound 16, and a second mold compound 18. In detail, the device substrate 12 may be formed from a multi-layer laminate. The thinned device die 14 is attached to a top surface of the device substrate 12, and includes a device region 20 and a number of bump structures 22. Herein, the device region 20 includes a back-end-of-line (BEOL) portion 24 and a front-end-of-line (FEOL) portion 26 with an active layer 28 and a contact layer 30. The active layer 28 resides over the contact layer 30, and the contact layer 30 resides over the BEOL portion 24.

For the purpose of this illustration, the active layer 28 may include a first component cell 32, a second component cell 34, isolation sections 36, and a passive section 38. In one embodiment, the first component cell 32 is configured to provide a first N-type field-effect transistor (NFET) and includes a first P-well 40 with a first N-source 42 and a first N-drain 44 inside, and a first N-well 46 encapsulating the first P-well 40. The second component cell 34 is configured to provide a second NFET and includes a second P-well 48 with a second N-source 50 and a second N-drain 52 inside, and a second N-well 54 encapsulating the second P-well 48. The first N-well 46 and the second N-well 54 may be deeply doped with a density of an N-dopant more than 1E15 cm-3. The first N-well 46 and the second N-well 54 are configured to provide isolation between the first NFET from the first component cell 32 and the second NFET from the second component cell 34, and allow the proper stacking of the first NFET and the second NFET in a switch configuration. The isolation sections 36, which may be formed of silicon dioxide, surround the first N-well 46 and the second N-well 54 separately, as to further isolate the first component cell 32 from the second component cell 34. The passive section 38 resides over the first component cell 32, the second component 34, and the isolation sections 36. A top surface of the passive section 38 is a top surface of the active layer 28. Herein, the first P-well 40, the second P-well 48, and the passive section 38 are from a same P-type silicon epitaxial layer of the bulk initial wafer (processing details are described in the following paragraphs). In different applications, the active layer 28 may include fewer or more component cells, and each component cell may be configured to provide an N-type, a P-type FET, a diode, or a resistor. In addition, the isolation sections 36 may be omitted in the active layer 28.

The contact layer 30 includes a first gate structure 56, a first source contact 58, a first drain contact 60, a first gate contact 62, a second gate structure 64, a second source contact 66, a second drain contact 68, a second gate contact 70, and vias 72 (only one via is labeled with a reference number for clarity), each of which is formed within an insulating material 74. The first gate structure 56 may be formed of silicon oxide, and extends from underneath the first N-source 42 to underneath the first N-drain 44. The first source contact 58, the first drain contact 60, and the first gate contact 62 are directly connected to and under the first N-source 42, the first N-drain 44, and the first gate structure 56, respectively. Similarly, the second gate structure 64 may be formed of silicon oxide, and extends from underneath the second N-source 50 to underneath the second N-drain 52. The second source contact 66, the second drain contact 68, and the second gate contact 70 are directly connected to and under the second N-source 50, the second N-drain 52, and the second gate structure 64, respectively.

The BEOL portion 24 includes multiple connecting layers 76 formed within dielectric layers 78. Each via 72 extends from the first source contact 58, the first drain contact 60, the second source contact 66, or the second drain contact 68 to a corresponding connecting layer 76. In this embodiment, the first N-drain 44 is electrically coupled to the second N-source 50 through the first drain contact 60, vias 72, one of the connecting layers 76, and the second source contact 66, such that the first NFET provided by the first component cell 32 and the second NFET provided by the second component cell 34 are coupled in series to form a switch. In some applications, the active layer 28 may provide more FETs (between 4 and 40), and the connecting layers 76 in the BEOL portion 24 connect these FETs in series to form a switch with a desired OFF state voltage. In some applications, the first component cell 32 and the second component cell 34 may not be electrically connected.

The bump structures 22 are formed at a bottom surface of the BEOL portion 24, and attached to the top surface of the device substrate 12. Herein, the bump structures 22 are electrically coupled to at least one of the first component cell 32 and the second component cell 34 (the first source contact 58 and the second drain contact 68 in this illustration) by certain ones of the connecting layers 76 and certain ones of the vias 72. The bump structures 22 may be solder balls or copper pillars.

The first mold compound 16 resides over the top surface of the device substrate 12, underfills and surrounds the thinned device die 14, and extends above a top surface of the thinned device die 14 to form an opening 80 over the top surface of the thinned device die 14 and within the first mold compound 16. Herein, the top surface of the thinned device die 14 is at the bottom of the opening 80. The first mold compound 16 may be an organic epoxy resin system or the like, which can be used as an etchant barrier to protect the thinned device die 14 against etching chemistries such as potassium hydroxide (KOH), sodium hydroxide (NaOH), and acetylcholine (ACH). In some applications, there may be an underfilling layer (not shown) residing over the top surface of the device substrate 12, such that the underfilling layer encapsulates the bump structures 22 and underfills the thinned device die 14 between the bottom surface of the BEOL portion 24 and the top surface of the device substrate 12. The underfilling layer may be formed of a same or different material as the first mold compound, and is configured to mitigate the stress effects caused by Coefficient of Thermal Expansion (CTE) mismatch between the thinned device die 14 and the device substrate 12. Herein, the first mold compound 16 resides over the underfilling layer and surrounds the thinned device die 14, but does not underfill the thinned device die 14.

The second mold compound 18 substantially fills the opening 80, and is in contact with the top surface of the thinned device die 14. The second mold compound 18 has a thermal conductivity greater than 1 W/m·K or greater than 10 W/m·K, has an electrical resistivity greater than 1E6 Ohm-cm, and has a low dielectric constant less than 8, or between 3 and 5 to yield low RF coupling. The second mold compound 18 may be formed of thermoplastics or thermoset materials, such as PPS (poly phenyl sulfide), overmold epoxies doped with boron nitride, alumina, carbon nanotubes, diamond-like thermal additives, or the like. The second mold compound 18 may be formed of the same or different material as the first mold compound 16. However, unlike the second mold compound 18, the first mold compound 16 does not have thermal conductivity, electrical resistivity, or dielectric constant requirements. Herein, a portion of the second mold compound 18 may reside over the first mold compound 16.

In one embodiment, the top surface of the thinned device die 14 is the top surface of the active layer 28, such that the second mold compound 18 is in contact with the active layer 28. In another embodiment, the thinned device die 14 may further include an interfacial layer (not shown herein) directly over the active layer 28 of the FEOL portion 26 and within the opening 80. The top surface of the thinned device die 14 is a top surface of the interfacial layer. As such, the second mold compound 18 is in contact with the interfacial layer. Herein, the interfacial layer is formed of silicon germanium (SiGe), or silicon with a P type dopant, such as boron, having a density greater than 1E16 cm-3 or greater than 1E18 cm-3, and is from the bulk initial wafer (processing details are described in following paragraphs). Notice that, regardless of the interfacial layer, there is no silicon material itself, which has a resistivity between 5 Ohm-cm and 30000 Ohm-cm, or between 5 Ohm-cm and 3000 Ohm-cm, or between 5 Ohm-cm and 50 Ohm-cm, residing between the second mold compound 18 and the top surface of the active layer 28.

FIGS. 2-12 provide an exemplary die-level packaging process that illustrates steps to fabricate the exemplary bulk CMOS device 10 shown in FIG. 1. Although the exemplary steps are illustrated in a series, the exemplary steps are not necessarily order dependent. Some steps may be done in a different order than that presented. Further, processes within the scope of this disclosure may include fewer or more steps than those illustrated in FIGS. 2-12.

Figure 2:
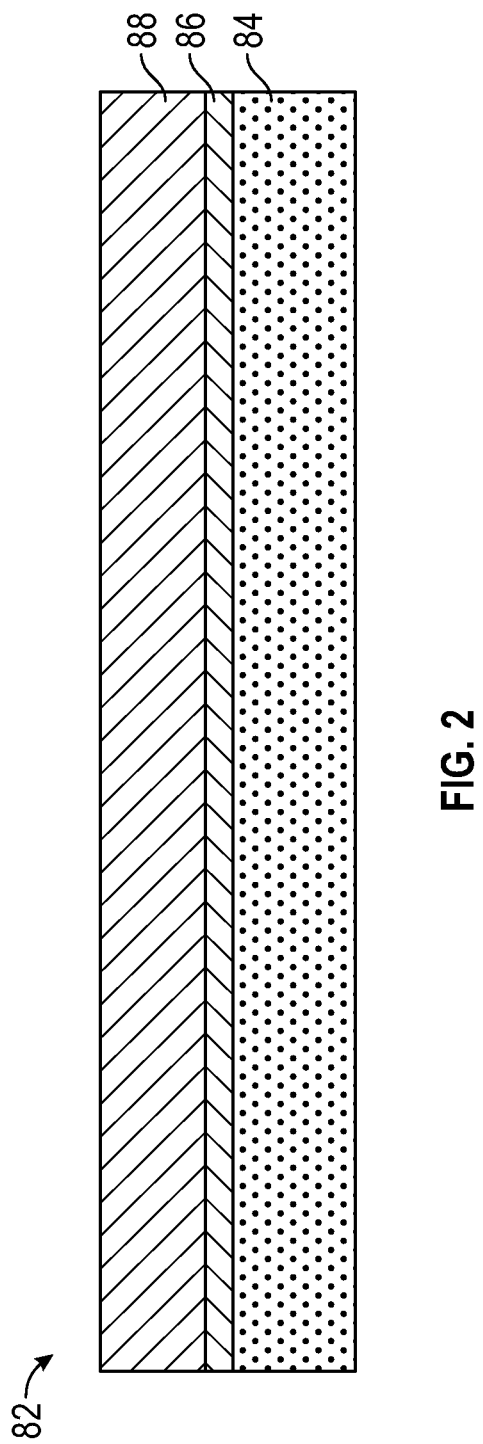

Initially, a bulk initial wafer 82 is provided as illustrated in FIG. 2. The bulk initial wafer 82 includes a silicon epitaxial layer 84, an interfacial layer 86 over the silicon epitaxial layer 84, and a bulk silicon handle substrate 88 over the interfacial layer 86. The interfacial layer 86 separates the silicon epitaxial layer 84 from the bulk silicon handle substrate 88.

Herein, the silicon epitaxial layer 84 may be formed of a P-type device grade silicon material, which has desired silicon epitaxy characteristics to form electronic devices. The interfacial layer 86 may be formed of an alloy with any molar ratio of Si and Ge, or a silicon material with a P type dopant, such as boron, having a density greater than 1E16 cm-3 or greater than 1E18 cm-3. For the SiGe alloy, the higher the Ge concentration, the better the etch selectivity between the bulk silicon handle substrate 88 and the interfacial layer 86, but also the more difficult the epitaxial growth of the silicon epitaxial layer 84 becomes. In one embodiment, the interfacial layer 86 may have a Ge concentration greater than 25%. In different applications, the Ge concentration may be uniform throughout the interfacial layer 86, or the Ge concentration may be vertically graded so as to yield the necessary strain relief for the growth of the silicon epitaxial layer 84. The bulk silicon handle substrate 88 may consist of conventional low cost, low resistivity, and high dielectric constant silicon. Typically, the bulk silicon handle substrate 88 has a resistivity between 5 Ohm-cm and 30000 Ohm-cm or between 10 Ohm-cm and 50 Ohm-cm. The silicon epitaxial layer 84 has higher resistivity and lower harmonic generation than the bulk silicon handle substrate 88. A thickness of the silicon epitaxial layer 84 may be between 10 nm and 300 nm, a thickness of the interfacial layer 86 may be between 100 nm and 1000 nm, and a thickness of the bulk silicon handle substrate 88 may be between 200 μm and 500 μm.

Next, the active layer 28 is formed from the silicon epitaxial layer 84, and underneath the interfacial layer 86, as illustrated in FIG. 3A. For the purpose of this illustration, the active layer 28 includes the first component cell 32, the second component cell 34, the isolation sections 36, and the passive section 38. In reality, the active layer 28 includes at least millions of component cells, one or more of which may realize an integrated circuit. In one embodiment, the active layer 28 is formed by a CMOS process, and the first component cell 32 and the second component cell 34 are configured to provide NFETs. The first (second) N-well 46(54) of the first (second) component cell 32 (34) may be formed by ion implantation in the silicon epitaxial layer 84, and separates a portion of the silicon epitaxial layer 84 from the other. This separated portion of the silicon epitaxial layer 84 is the first (second) P-well 40(48) of the first (second) component cell 32 (34). The first N-well 46 and the second N-well 54 are configured to provide isolation between the first P-well 40 and the second P-well 48. The first (second) N-source 42 (50) and the first (second) N-drain 44 (52) are formed by ion implantation in the first (second) P-well 40(48). The ion implantation may be realized by Halo implant, LDD implant, or other implanting technologies.

The isolation sections 36 of the active layer 28 may be formed by shallow trench isolation (STI). The isolation sections 36 surround the first N-well 46 and the second N-well 54 separately, and extend from a bottom surface of the silicon epitaxial layer 84 into the silicon epitaxial layer 84. As such, the isolation sections 36 further isolate the first component cell 32 from the second component cell 34. If there is no isolation section 36 included in the active layer, portions of the silicon epitaxial layer 84 may be surrounding and/or in between the first N-well 46 and the second N-well 54. Besides the first component cell 32, the component cell 34, and the isolation sections 36, a portion of the silicon epitaxial layer 84 remains as the passive section 38, which resides over the first component cell 32, the second component 34, and the isolation sections 36. A top surface of the passive section 38 is a top surface of the active layer 28. The interfacial layer 86 directly resides over the active layer 28, and the bulk silicon handle substrate 88 remains over the interfacial layer 86.

FIG. 3B shows an alternative active layer 28A formed from the silicon epitaxial layer 84. Herein, besides the first component cell 32, the isolation sections 36, and the passive section 38, the alternative active layer 28A also includes an alternative second component cell 34A, which is configured to provide a PFET. The alternative second component cell 34A includes an alternative second N-well 54A with a P-source 90 and a P-drain 92 inside. The alternative second N-well 54A may be formed by ion implantation in the silicon epitaxial layer 84, and the P-source 90 and the P-drain 92 are formed by ion implantation in the alternative second N-well 54A. The ion implantation may be realized by Halo implant, LDD implant, or other implanting technologies. The isolation sections 36 surround the first N-well 46 and the alternative second N-well 54A separately, and the passive section 38 resides over the first component cell 32, the alternative second component 34A, and the isolation sections 36. A top surface of the passive section 38 is a top surface of the alternative active layer 28A. The interfacial layer 86 directly resides over the alternative active layer 28A, and the bulk silicon handle substrate 88 remains over the interfacial layer 86.

Figure 4:
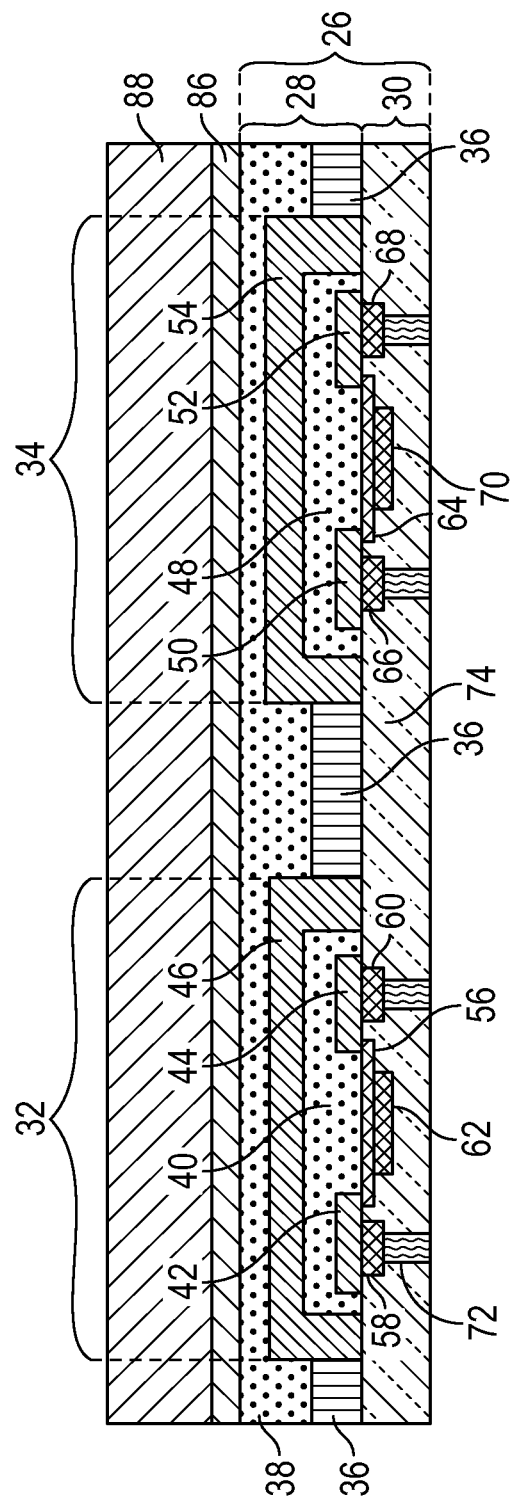

The contact layer 30 is then formed underneath the active layer 28 to complete the FEOL portion 26, as illustrated in FIG. 4. The contact layer 30 may also be formed by the CMOS process. The first (second) gate structure 56 (64) extends underneath from the first (second) N-source 42 (50) to the first (second) N-drain 44 (52). The first (second) source contact 58 (66), the first (second) drain contact 60 (68), and the first (second) gate contact 62 (70) are directly connected to and under the first (second) N-source 42 (50), the first (second) N-drain 44 (52), and the first (second) gate structure 56 (64), respectively. The first gate structure 56, the first source contact 58, the first drain contact 60, the first gate contact 62, the second gate structure 64, the second source contact 66, the second drain contact 68, and the second gate contact 70 are formed within the insulating material 74. Each via 72 extends from the first source contact 58/the first drain contact 60/the second source contact 66/the second drain contact 68 to a bottom surface of the contact layer 30.

Figure 5:
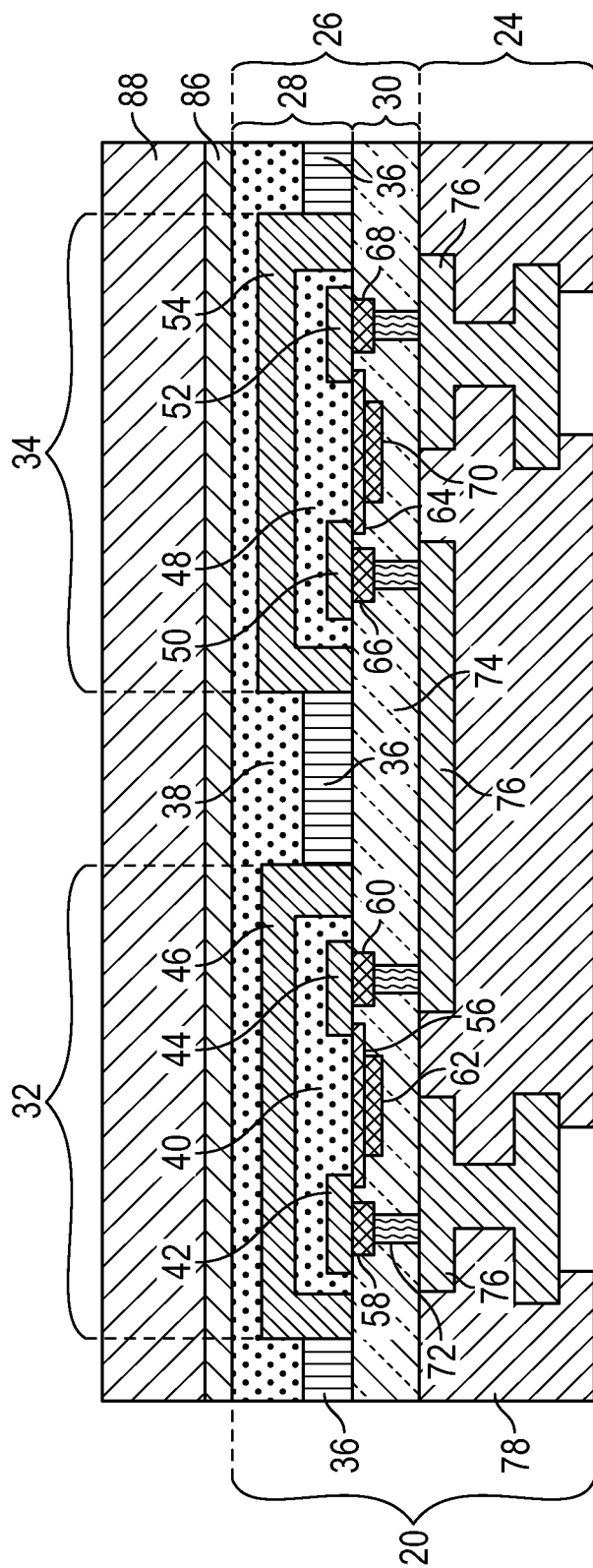

After the FEOL portion 26 is completed, the BEOL portion 24 is formed underneath the FEOL portion 26 to provide the device region 20, as illustrated in FIG. 5. The BEOL portion 24 includes the connecting layers 76 within the dielectric layers 78. Each via 72 exposed at the bottom surface of the contact layer 30 is electrically coupled to a corresponding connecting layer 76. When the first component cell 32 and the second component cell 34 are configured to provide NFETs, the first component cell 32 and the second component cell 34 may be connected in series by one of the connecting layers 76 to form a CMOS switch. When the first component cell 32 and the second component cell 34 are configured to provide different types of FETs, the first component cell 32 and the second component cell 34 may not be electrically connected. Portions of certain ones of the connecting layers 76 are exposed through the dielectric layers 78 at the bottom surface of the BEOL portion 24. In addition, the BEOL portion 24 may further provide metal-insulator-metal (MIM) capacitors (not shown) by utilizing the connecting layers 76 and the dielectric layers 78.

Figure 6:
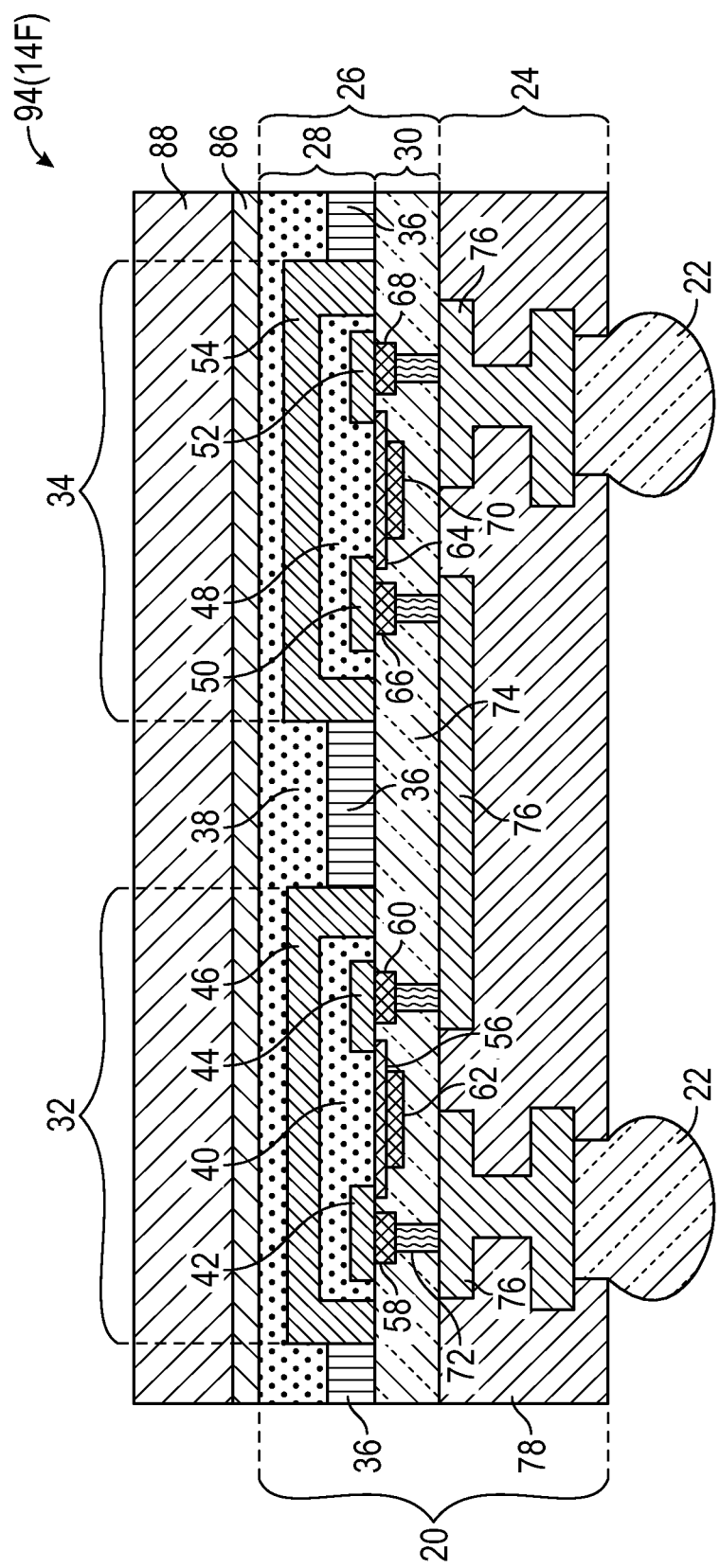

The bump structures 22 are then formed at the bottom surface of the BEOL portion 24 to provide a device wafer 94, as depicted in FIG. 6. Each bump structure 22 is in contact with the exposed portion of a corresponding connecting layer 76. Herein, the bump structures 22 are electrically coupled to the first component cell 32 (the first source contact 58 in this illustration) and the second component cell 34 (the second drain contact 68 in this illustration) by the connecting layers 76 and vias 72. The bump structures 22 may be formed by a solder ball bumping technology or a copper pillar packaging technology. Each bump structure 22 protrudes from the bottom surface of the BEOL portion 24 between 20 μm and 350 μm. The device wafer 94 is then singulated into individual dies (not shown), each of which realizes a circuit function and includes one or more component cells in the active layer 28. Herein, an exemplary singulated device die 14F includes the device region 20 with the first component cell 32 and the second component cell 34, the bump structures 22 at the bottom of the device region 20, the interfacial layer 86 over the device region 20, and the bulk silicon handle substrate 88 over the interfacial layer 86. A top surface of the device die 14F is the backside of the bulk silicon handle substrate 88.

Figure 7:
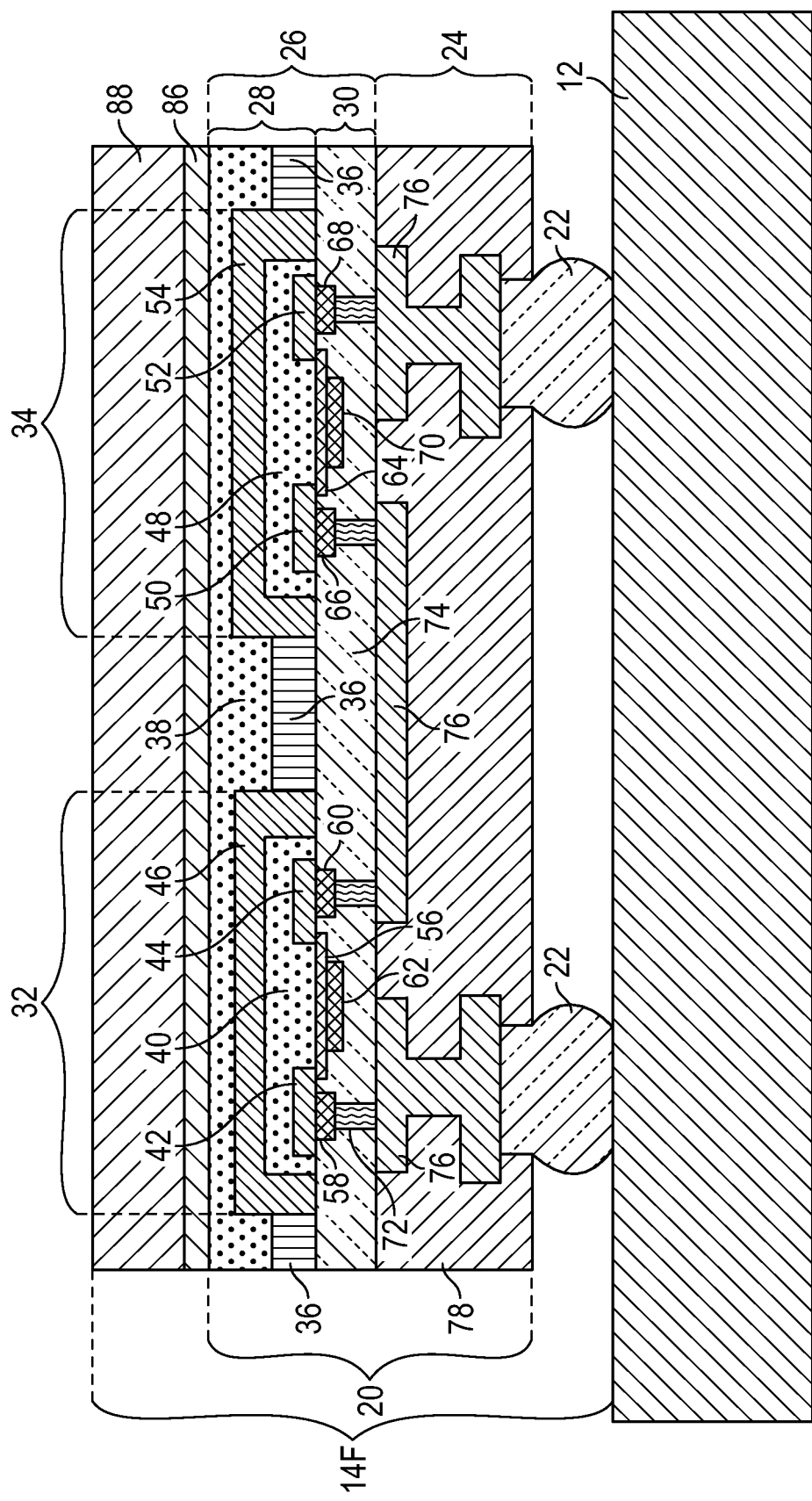
Figure 8:
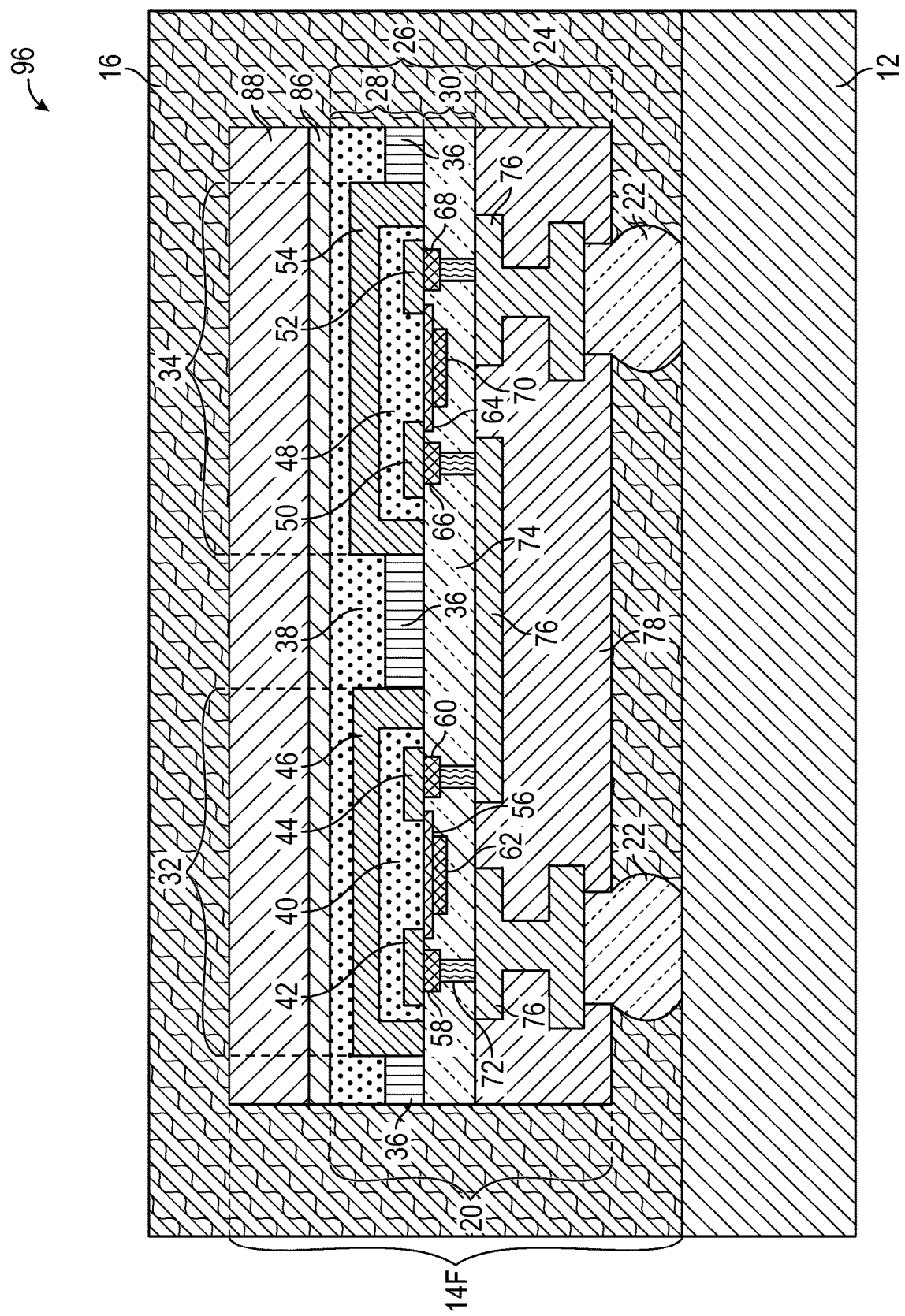

Next, the device die 14F is mounted to the device substrate 12 as depicted in FIG. 7. The bump structures 22 of the device die 14F are attached to the top surface of the device substrate 12, and the backside of the bulk silicon handle substrate 88 is the tallest component after the attaching process. In different applications, there may be multiple device dies mounted to the device substrate 12. The first mold compound 16 is then applied over the top surface of the device substrate 12 to provide a precursor package 96 as illustrated in FIG. 8. The device die 14F is fully encapsulated by the first mold compound 16. If there are multiple device dies mounted to the device substrate 12, the first mold compound 16 individually encapsulates each device die, and separate one from each other.

The first mold compound 16 may be applied by various procedures, such as sheet molding, overmolding, compression molding, transfer molding, dam fill encapsulation, and screen print encapsulation. The first mold compound 16 may be formed from an organic epoxy resin system or the like, such as Hitachi Chemical Electronic Materials GE-100LFC, which can be used as an etchant barrier to protect the device die 14F against etching chemistries such as KOH, NaOH, and ACH. A curing process (not shown) is followed to harden the first mold compound 16. The curing temperature may be between 100° C. and 320° C. depending on which material is used as the first mold compound 16.

Notice that, if the final bulk CMOS device 10 includes an underfilling layer, there may be extra steps to form the underfilling layer (not shown) before applying the first mold compound 16 over the top surface of the device substrate 12. Forming the underfilling layer is provided by applying an underfilling material over the top surface of the device substrate 12 and then curing the underfilling material to form the underfilling layer. The underfilling layer encapsulates the bump structures 22 and underfills the device die 14F between the bottom surface of the BEOL portion 24 and the top surface of the device substrate 12. The first mold compound 16 is then applied over the underfilling layer, and encapsulates at least the sides and the top surface of the device die 14F.

Figure 9:
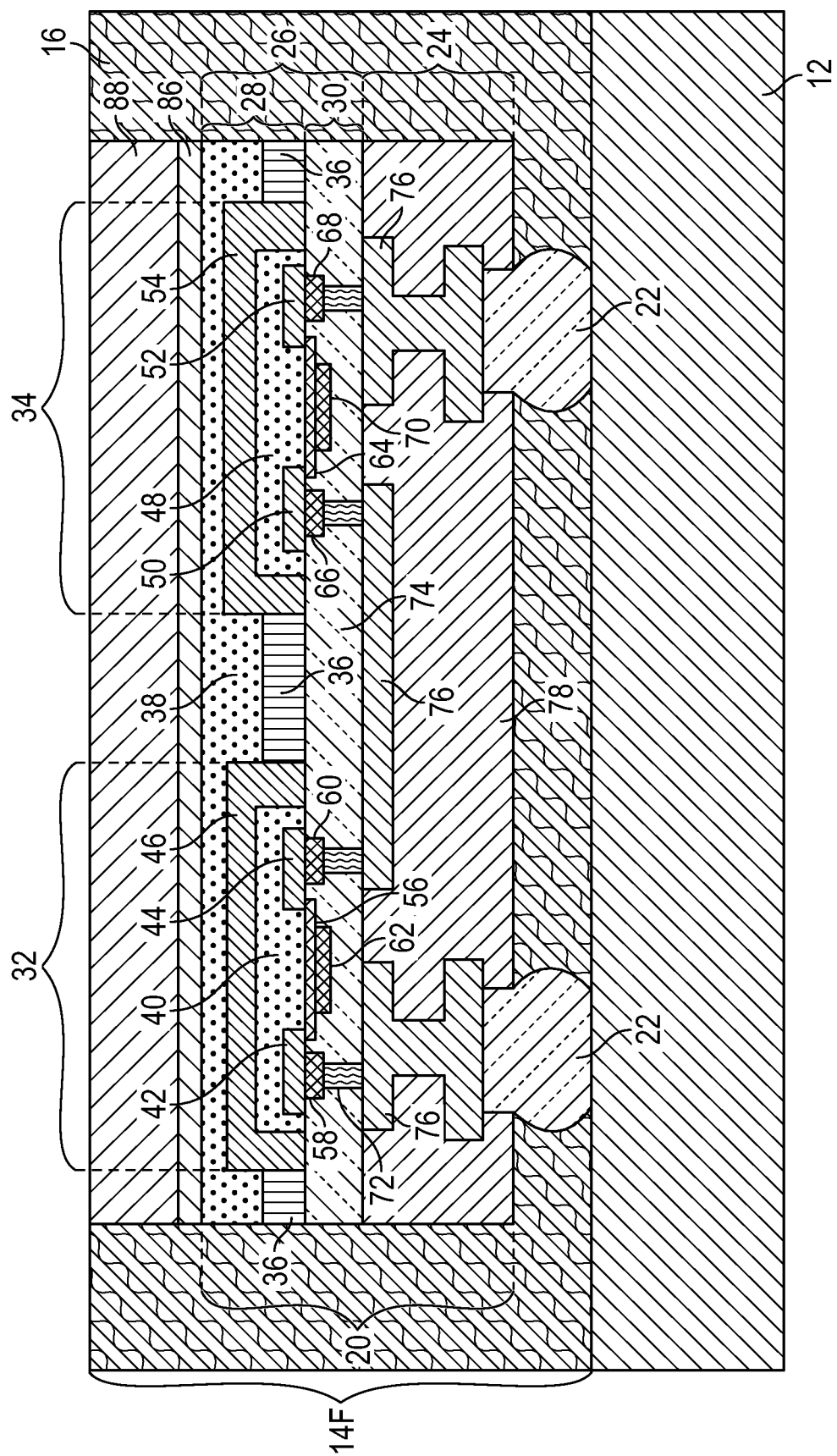
Figure 10:
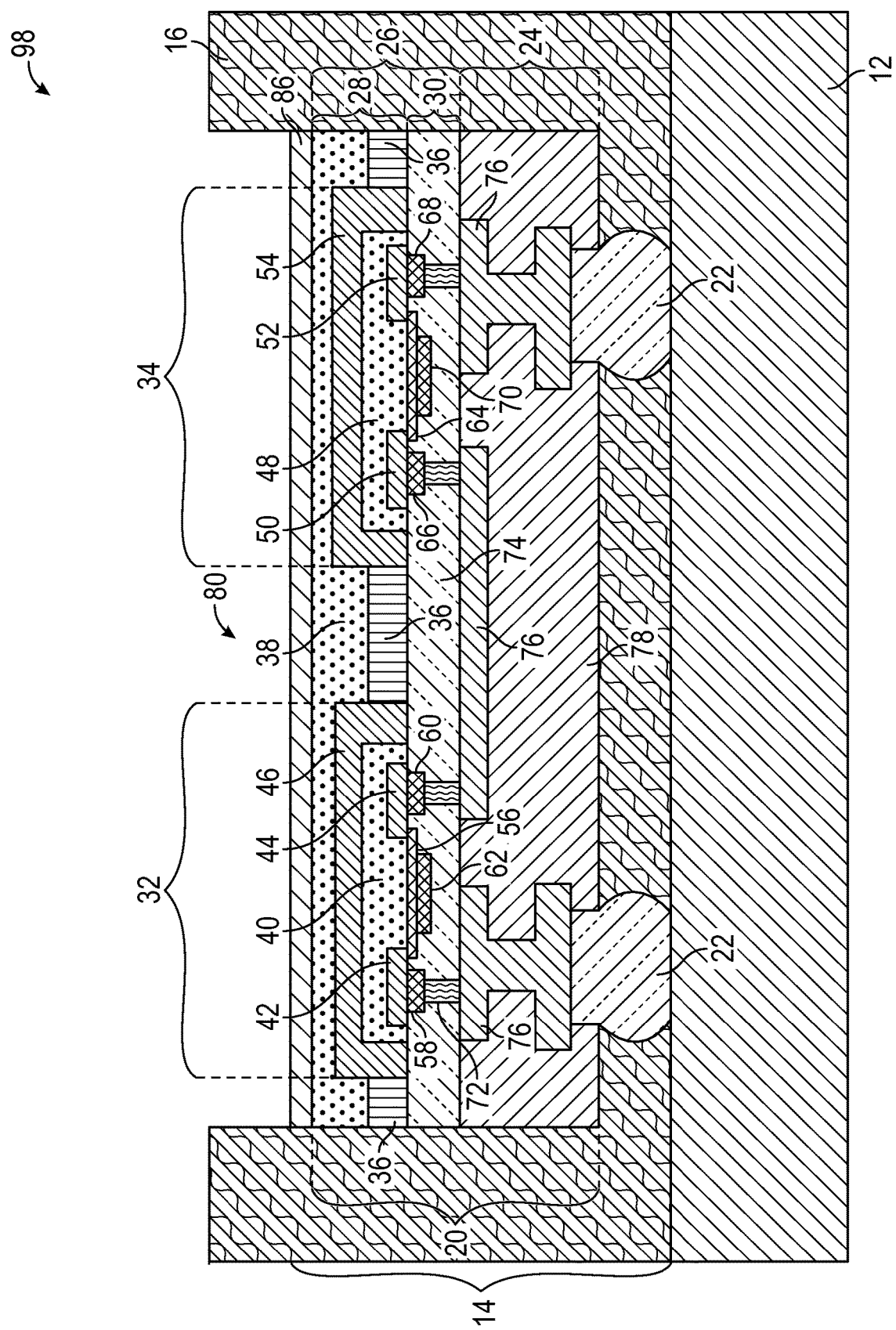

FIG. 9 shows a thinning procedure that the first mold compound 16 is thinned down to expose the backside of the bulk silicon handle substrate 88 of the device die 14F. The thinning procedure may be done with a mechanical grinding process. The bulk silicon handle substrate 88 is then selectively removed to provide an etched package 98, where the selective removal is stopped on the interfacial layer 86, as illustrated in FIG. 10. The removal of the bulk silicon handle substrate 88 from the device die 14F provides the thinned device die 14 and forms the opening 80 within the first mold compound 16 and over the thinned device die 14. The interfacial layer 86 is exposed at the bottom of the opening 80.

When the interfacial layer 86 is formed of SiGe, the bulk silicon handle substrate 88 may be removed by a dry etching system, such as the SELECTRA tools from Applied Materials Co. Because the interfacial layer 86 and the bulk silicon handle substrate 88 have different etching speeds, the etching system is capable of identifying the presence of the interfacial layer 88. Consequently, the etching system is able to indicate when to stop the etching process.

When the interfacial layer 86 is formed of SiGe with a Ge concentration greater than 25%, the bulk silicon handle substrate 88 may be removed by a wet etching process with TMAH. This is because a high Ge concentration (>25%) layer may effectively stop the etching process for the bulk silicon handle substrate 88 by TMAH. A wet etching process with similar appropriate silicon wet etchants or a dry etching process may also be applied to remove the bulk silicon handle substrate 88 herein.

In addition, when the interfacial layer 86 is formed of silicon with a P type dopant, such as boron, having a density greater than 1E16 cm-3 or greater than 1E18 cm-3, the bulk silicon handle substrate 88 may be removed by a wet etching process with a hydroxide base wet chemistry, such as TMAH or KOH. This is because a heavily P-doped layer may effectively stop the etching process for the bulk silicon handle substrate 88 by TMAH or KOH. A wet etching process with similar appropriate silicon wet etchants or a dry etching process may also be applied to remove the bulk silicon handle substrate 88 herein. Regardless of the material used to form the interfacial layer 86 and the etching process used to remove the bulk silicon handle substrate 88, the first mold compound 16 protects the sides and bottom surface of the thinned device die 14 from the etching process.

Figure 11:
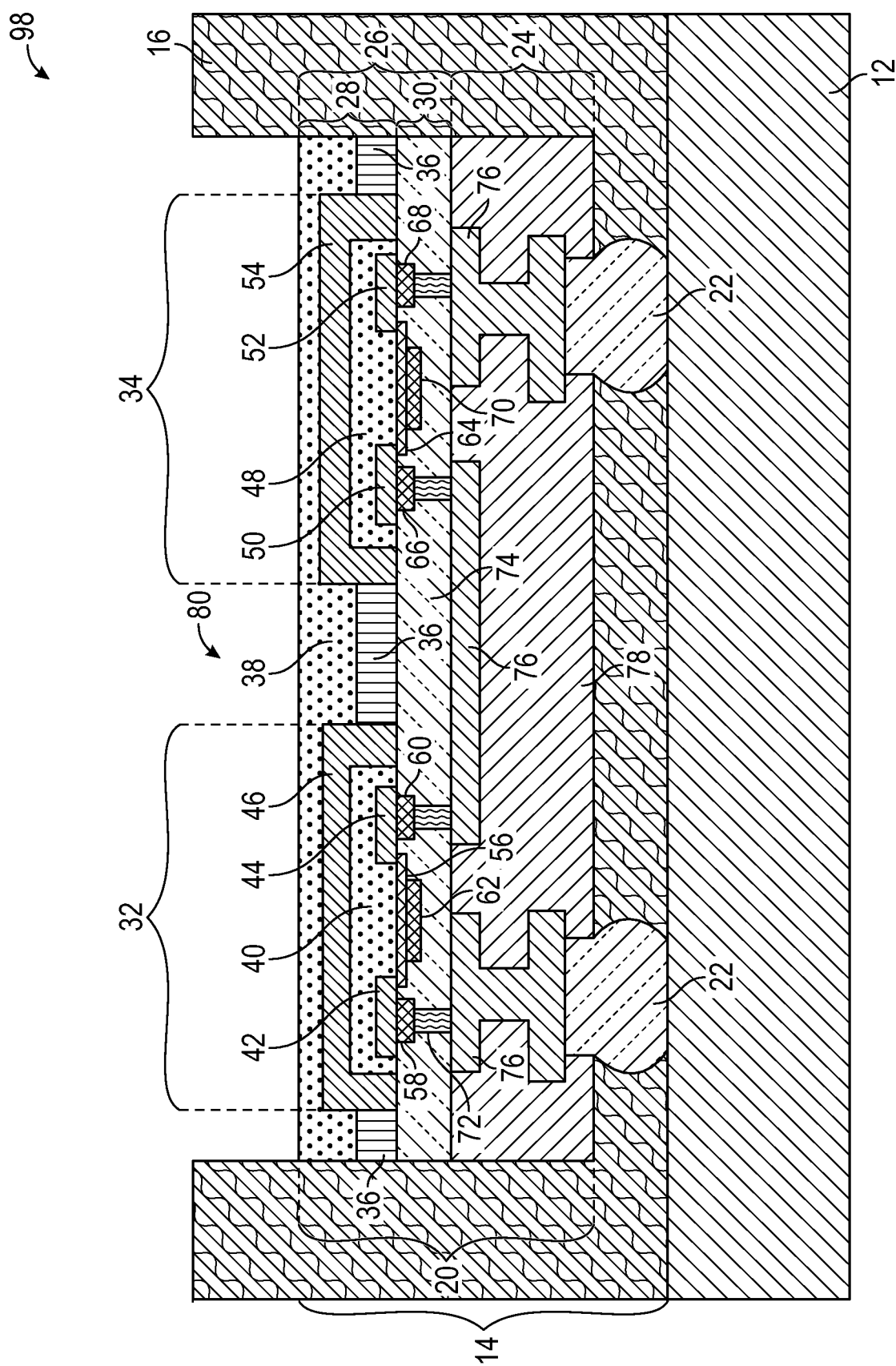

In some applications, the interfacial layer 86 may be also removed, as illustrated in FIG. 11. For instance, if the interfacial layer 86 is heavily doped with a P type dopant, the interfacial layer 86 may provide a pseudo ground-plane over the first component cell 32 and the second component cell 34 (switch region), which is an undesirable condition. The interfacial layer 86 may be removed by wet or dry etching chemistries in another etching process. Herein, the thinned device die 14 does not include the interfacial layer 86, and the active layer 28 is exposed at the bottom of the opening 80. If the interfacial layer 86 is formed of SiGe with a high Ge concentration (>25%), the interfacial layer 86 may be left in the thinned device die 14 and exposed at the bottom of the opening 80, since the interfacial layer 86 may be engineered to be undoped and non-conducting.

Figure 12:
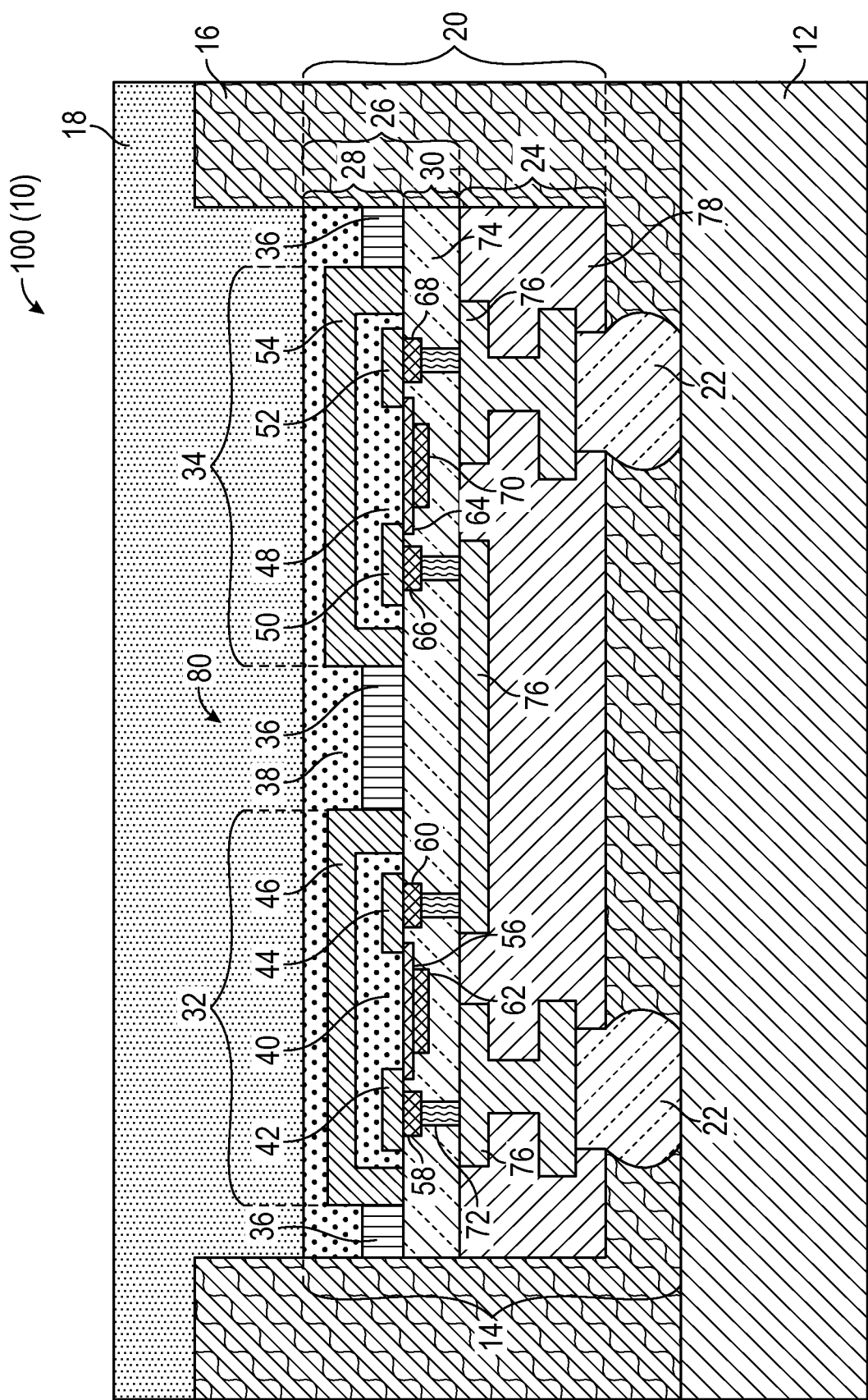

Next, the second mold compound 18 is applied over the etched package 98 to provide a mold device package 100, as illustrated in FIG. 12. The second mold compound 18 substantially fills the opening 80 and is in contact with the top surface of the thinned device die 14. Herein, substantially filling an opening refers to filling at least 75% of the entire opening. If the thinned device die 14 does not include the interfacial layer 86, the second mold compound 18 is in contact with the active layer 28. If the thinned device die 14 includes the interfacial layer 86, the second mold compound 18 is in contact with the interfacial layer 86. In either case, there is no bulk silicon handle substrate 88 left in the opening 80, such that there is no bulk silicon handle substrate 88 between the second mold compound 18 and the active layer 28. In some applications, portions of the second mold compound 18 may extend over the first mold compound 16.

The second mold compound 18 may have a superior thermal conductivity greater than 1 W/m·K, or greater than 10 W/m·K, and may have a dielectric constant less than 8, or between 3 and 5. The second mold compound 18 may be formed of thermoplastics or thermoset materials, such as PPS (poly phenyl sulfide), overmold epoxies doped with boron nitride, alumina, carbon nanotubes, diamond-like thermal additives, or the like. The second mold compound 18 may be formed of the same or different material as the first mold compound 16. However, unlike the second mold compound 18, the first mold compound 16 does not have thermal conductivity, electrical resistivity, or dielectric constant requirements. The second mold compound 18 may be applied by various procedures, such as compression molding, sheet molding, overmolding, transfer molding, dam fill encapsulation, and screen print encapsulation. A curing process (not shown) is followed to harden the second mold compound 18. The curing temperature is between 100° C. and 320° C. depending on which material is used as the second mold compound 18. After the curing process, the second mold compound 18 may be thinned and/or planarized (not shown).

Lastly, the mold device package 100 may be marked, diced, and singulated into individual devices (not shown). The bulk CMOS device 10 is an exemplary singulated device, which achieves switch functionality.

Those skilled in the art will recognize improvements and modifications to the preferred embodiments of the present disclosure. All such improvements and modifications are considered within the scope of the concepts disclosed herein and the claims that follow.

What is claimed is:

1. An apparatus comprising:
   a device substrate having a top surface;
   a thinned device die comprising a device region and a plurality of bump structures, wherein:
   the device region comprises a back-end-of-line (BEOL) portion with a plurality of connecting layers and a front-end-of-line (FEOL) portion residing over the BEOL portion, wherein the FEOL portion comprises a contact layer and an active layer that resides over the contact layer and has a first component cell; and
   the plurality of bump structures are formed at a bottom surface of the BEOL portion and attached to the top surface of the device substrate, wherein the plurality of bump structures are electrically coupled to the FEOL portion via certain ones of the plurality of connecting layers;
   a first mold compound residing over the top surface of the device substrate, surrounding the thinned device die, and extending vertically beyond the thinned device die to define an opening over the thinned device die and within the first mold compound, wherein a top surface of the thinned device die is at the bottom of the opening; and
   a second mold compound substantially filling the opening and in contact with the top surface of the thinned device die, wherein a silicon material, which has a resistivity between 5 Ohm-cm and 30000 Ohm-cm, does not exist between the second mold compound and the active layer of the thinned device die.

2. The apparatus of claim 1 wherein the active layer further includes isolation sections surrounding the first component cell.

3. The apparatus of claim 2 wherein:
   the first component cell is configured to provide an N-type field-effect transistor (NFET), wherein the first component includes a P-well with an N-source and an N-drain inside, and an N-well encapsulating the P-well and surrounded by the isolation sections;
   the N-well is doped with an N-dopant having a density more than 1E15 cm-3; and
   the active layer further includes a P-type passive section over both the first component cell and the isolation sections.

4. The apparatus of claim 2 wherein:
   the first component cell is configured to provide a P-type field-effect transistor (PFET) and includes an N-well with a P-source and a P-drain, wherein the N-well is surrounded by the isolation sections;
   the N-well is doped with an N-dopant having a density between 1E14 cm-3 and 1E19 cm-3; and
   the active layer further includes a P-type passive section over both the first component cell and the isolation sections.

5. The apparatus of claim 1 wherein the active layer further includes a second component cell and isolation sections that separate the first component cell from the second component cell.

6. The apparatus of claim 5 wherein the first component cell and the second component cell are electrically coupled by one of the plurality of connecting layers within the BEOL portion.

7. The apparatus of claim 6 wherein:
   the first component cell is configured to provide a first NFET, wherein the first component cell includes a first P-well with a first N-source and a first N-drain inside, and a first N-well encapsulating the first P-well;
   the second component cell is configured to provide a second NFET, wherein the second component cell includes a second P-well with a second N-source and a second N-drain inside, and a second N-well encapsulating the second P-well;
   the first N-well and the second N-well are doped with an N-dopant having a density more than 1E15 cm-3;
   the isolation sections reside between first N-well of the first component cell and the second N-well of the second component cell;
   the first N-source of the first component cell is electrically coupled to the second N-drain of the second component cell by one of the plurality of connecting layers within the BEOL portion; and
   the active layer further includes a P-type passive section over the first component cell, the second component cell, and the isolation sections.

8. The apparatus of claim 1 wherein the thinned device die further comprises an interfacial layer directly over the active layer and within the opening, wherein:
   the interfacial layer is formed of silicon germanium (SiGe), or silicon with a boron dopant having a density greater than 1E16 cm-3;
   a top surface of the interfacial layer is the top surface of the thinned device die; and
   the second mold compound is in contact with the interfacial layer.

9. The apparatus of claim 1 wherein a top surface of the active layer is the top surface of the thinned device die, such that the second mold compound is in contact with the top surface of the active layer.

10. The apparatus of claim 1 wherein the second mold compound has a thermal conductivity greater than 1 W/m·K.

11. The apparatus of claim 1 wherein the second mold compound has a dielectric constant less than 8.

12. The apparatus of claim 11 wherein the first mold compound and the second mold compound have a dielectric constant between 3 and 5.

* * * * *